(12) United States Patent
Hiraoka et al.

(10) Patent No.: US 7,370,412 B2
(45) Date of Patent: May 13, 2008

(54) METHOD FOR CONNECTING ELECTRONIC DEVICE

(75) Inventors: Toshiro Hiraoka, Kanagawa-Ken (JP);
Mitsuyoshi Endo, Kanagawa-Ken (JP);
Naoko Yamaguchi, Kanagawa-Ken (JP);
Yasuyuki Hotta, Tokyo (JP);
Shigeru Matake, Kanagawa-Ken (JP);
Hideo Aoki, Kanagawa-Ken (JP); Misa Sawanobori, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 354 days.

(21) Appl. No.: 10/611,895

(22) Filed: Jul. 3, 2003

(65) Prior Publication Data
US 2004/0009683 A1    Jan. 15, 2004

(30) Foreign Application Priority Data
Jul. 4, 2002   (JP) .............................. 2002-195690

(51) Int. Cl.
*H01K 3/10* (2006.01)

(52) U.S. Cl. .......................... 29/852; 29/846; 174/259; 427/97.1

(58) Field of Classification Search ................. 29/846, 29/852; 174/259; 427/97.1
See application file for complete search history.

(56) References Cited

U.S. PATENT DOCUMENTS

| | | | |
|---|---|---|---|
| 5,498,467 A | 3/1996 | Meola | |
| 6,465,742 B1 * | 10/2002 | Hiraoka et al. | 174/255 |
| 6,703,565 B1 * | 3/2004 | Tsukamoto et al. | 174/259 |
| 7,017,264 B2 * | 3/2006 | Ikeda et al. | 29/852 |
| 2003/0022102 A1 * | 1/2003 | Hiraoka et al. | 430/270.1 |

FOREIGN PATENT DOCUMENTS

| | | |
|---|---|---|
| JP | 6-275662 | 9/1994 |
| JP | 8-167630 | 6/1996 |
| JP | 2000-341032 | 8/2000 |
| JP | 2001-345537 | 12/2001 |

\* cited by examiner

*Primary Examiner*—Rick K Chang
(74) *Attorney, Agent, or Firm*—Oblon, Spivak, McClelland, Maier & Neustadt, P.C.

(57) ABSTRACT

An electronic device connecting method according to a first aspect of the present invention includes: mounting an electronic device having at least one electrode portion on a sheet-like porous member having a hole therein so that the electrode portion is close to the porous member; selectively irradiating a predetermined region of the porous member, on which the electronic device is mounted, with energy lines to form a latent image in an irradiated or non-irradiated portion of the porous member, the predetermined region including a portion close to the electrode portion; after irradiating with the energy lines, filling a conductive material in a hole of the latent image of the porous member to form a conductive portion; and bonding and integrating the porous member, in which the conductive portion is formed, to and with the electronic device.

6 Claims, 13 Drawing Sheets

METHOD FOR CONNECTING ELECTRONIC DEVICE

CROSS REFERENCE TO RELATED APPLICATION

This application is based upon and claims benefit of priority from the prior Japanese Patent Application No. 2002-195690, filed on Jul. 4, 2002; the entire contents of which are incorporated herein by reference.

BACKGROUND OF THE INVENTION

1. Field of the Invention

The present invention relates to a method for connecting an electronic device.

2. Related Art

In order to enhance the function of information portable apparatuses such as portable telephones and wearable computers, it is required to provide small, light and thin semiconductor packages, and modules wherein electronic devices are integrated at a high density. In a usually semiconductor package, an electrode (pad) of a semiconductor chip is connected to a package substrate via a solder bump or the like. However, since the bump exists, the semiconductor chip can not closely contact the package substrate, so that there is a problem in that it is difficult to thin the semiconductor package. In addition, there is a problem in that it is difficult to align the semiconductor chip with the package substrate.

In order to eliminate such problems, there is a method for directly forming a package wiring layer on a semiconductor chip. However, it is difficult to decrease the diameter of a via contact, and since the via contact connected to a pad is formed separately from the package wiring, the via contact is easily displaced from the package wiring. In addition, the displacement of the pad from the via contact also occurs, so that it is difficult to connect the via contact with the narrow pitch pad. Moreover, if it is failed to form a via contact or package wiring or to connect the via contact or package wiring to the pad, it is difficult to reuse (rework) the semiconductor chip.

As methods for forming a small-diameter via contact, there are proposed methods for forming a conductive column which passes thorough an insulating layer corresponding to a via contact (see, e.g. Japanese Patent Laid-Open No. 55-161306, Japanese Patent Laid-Open No. 7-207450, U.S. Pat. No. 5,498,467, and Japanese Patent Laid-Open No. 11-25755). In these methods, a conductive material, such as copper, is filled in a desired region of a porous sheet having a three-dimensional continuous hole to form a conductive column passing through the sheet from the surface to reverse thereof. In addition, Japanese Patent Application No. 11-262328 (Japanese Patent Laid-Open No. 2001-83347) proposes a method for filling a porous sheet with a conductive material in accordance with the pattern of a via contact or wiring to form a multilayer interconnection substrate.

However, the mechanical strength and dimensional stability of the porous sheet are inferior to those of a non-porous usual resin sheet. Therefore, the pattern of a via contact or wiring formed in the porous sheet is easily distorted, and the via contact or wiring is easily displaced from the pad.

As described above, in conventional methods for producing a semiconductor package, it is difficult to narrow the pitch of pads of a semiconductor chip. In addition, in a method for directly forming a package wiring layer on an electronic device, e.g. a semiconductor chip, it is difficult to rework electronic devices if displacement and so forth occur. Also in a method for forming a via contact or wiring in a porous sheet to connect it to the pad of an electronic device, the mechanical strength and dimensional stability of the porous sheet are inferior, so that there is a problem in that the displacement from the pad is easy to occur.

SUMMARY OF THE INVENTION

An electronic device connecting method according to a first aspect of the present invention includes: mounting an electrode of an electronic device closely on a sheet-like porous member having a hole, the porous member having a photosensitive layer, which produces or eliminates an ion exchange group by irradiation with energy beams, on a surface in the hole of the porous member; selectively irradiating a predetermined region of the porous member, on which the electronic device is mounted, with energy beams to form a latent image in an irradiated or non-irradiated portion of the porous member, the predetermined region including a portion close to the electrode; after irradiating with the energy beams, filling a conductive material in a hole in the latent image of the porous member to form a conductive portion; and bonding the porous member, in which the conductive portion is formed, to the electronic device.

An electronic device connecting method according to a second aspect of the present invention includes: fixing a sheet-like porous member having a hole to a carrier sheet by pressure sensitive adhesion, the porous member having a photosensitive layer which produces or eliminates an ion exchange group by irradiation with energy beams, on a surface in the hole of the porous member; selectively irradiating a predetermined region of the porous member with energy beams to form a latent image in an irradiated or non-irradiated portion of the porous member; after irradiating with the energy beams, mounting an electrode of an electronic device closely on the porous member, and peeling the carrier sheet off to transfer the electronic device to the porous member; filling a conductive material in a hole in the latent image of the porous member after the electronic device is transferred; and bonding the porous member after the conductive portion is formed to the electronic device.

An electronic device connecting method according to a third aspect of the present invention includes: fixing a sheet-like porous member having a hole to a first carrier sheet by pressure sensitive adhesion to arrange the porous member on the first carrier sheet, the porous member having a photosensitive layer, which produces or eliminates an ion exchange group by irradiation with energy beams, on a surface in the hole of the porous member; arranging an electronic device having an electrode on a second carrier sheet so as to expose the electrode; synchronously feeding the porous member and the electronic device, and peeling the porous member off from the first carrier sheet to fix the porous member to the electronic device by pressure sensitive adhesion; selectively irradiating a predetermined region of the porous member with energy beams to form a latent image in an irradiated or non-irradiated portion of the porous member; after irradiating with the energy beams, filling a conductive material in a hole in the latent image of the porous member to form a conductive portion; and bonding the porous member, in which the conductive portion is formed, to the electronic device.

An electronic device connecting method according to a fourth aspect of the present invention includes: fixing a sheet-like porous member having a hole to a first carrier sheet by pressure sensitive adhesion to arrange the porous member on the first carrier sheet, the porous member having a photosensitive layer, which produces or eliminates an ion exchange group by irradiation with the energy beams, on a surface in the hole of the porous member; arranging an electronic device having an electrode on a second carrier sheet so as to expose the electrode; selectively irradiating a predetermined region of the porous member with energy beams to form a latent image in an irradiated or non-irradiated portion of the porous member; after irradiating with the energy beam, synchronously feeding the porous member and the electronic device, and peeling the porous member off from the first carrier sheet to fix the porous member to the electronic device by pressure sensitive adhesion; filling a conductive material in a hole in the latent image of the porous member to form a conductive portion; and bonding the porous member, in which the conductive portion is formed, to the electronic device.

DESCRIPTION OF EMBODIMENTS

Figure 1A:
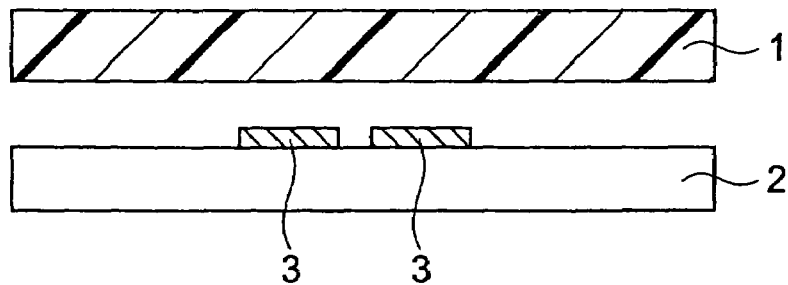
FIGS. 1A through 1D are sectional views showing steps in a method for connecting an electronic device according to a first embodiment of the present invention.
Figure 1B:
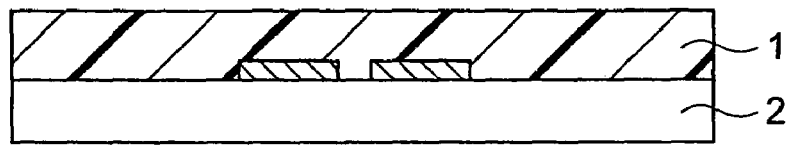

The embodiments of the present invention will be described below. In the following explanation, a sheet-like porous member is equivalent to a porous sheet.

A method for connecting an electronic device according to an embodiment of the present invention comprises: mounting an electronic device, such as a semiconductor device, on a porous sheet; irradiating the porous sheet having the electronic device with an energy beam to form a latent image for a via contact and/or wiring thereon; filling a conductive material in a latent image portion of the porous sheet, on which the latent image for the via contact and/or wiring is formed, to form a via contact and/or wiring which is to be a conductive portion; and bonding and integrating the porous sheet, on which the via contact and/or wiring is formed, to and with the electronic device.

Since the reverse of the porous sheet, on which the electronic device is mounted, can be irradiated with the energy beam so as to align with the mounted electrode of the electronic device, it is difficult to cause the displacement of the electrode from the wiring. In addition, since the conductive portion is formed after the electronic device is mounted on the porous sheet, the electric connection between the electrode and the conductive portion can be good. Moreover, the electronic device can closely contact the porous sheet.

Furthermore, throughout the specification, the term "pressure sensitive adhesion" means temporary adhesion. The pressure sensitive adhesive can be bonded by applying only slight pressure and can be strongly bonded due to its cohesion and elasticity, but it can be peeled off again. Contrary to the pressure sensitive adhesion, throughout the specification, the term "adhesion" means to use a liquid when two objects to be bonded are applied to each other, to change the liquid to a solid by heating or a chemical reaction after the liquid wets on the objects to become familiar therewith, and to give the ability to strongly bond on the interface to be resistant to peeling. That is, the term "adhesion" means to wet in a liquid state and bond in a solid state.

On the other hand, the term "pressure sensitive adhesion" means to wet on objects to be bonded in a soft solid state and to be resistant to peeling without causing change of state unlike adhesion. In order to achieve the pressure sensitive adhesion between the porous sheet and the electronic device or carrier sheet according to the present invention, it has the property of liquid (flowability) to wet in an object to be bonded and has the property of solid (cohesion) to be resistant to peeling. As described above, the pressure sensitive adhesive gives the ability to be resistant to peeling while it is in a solid state. For that reason, there is not the possibility that the holes of the porous sheet are closed unlike an adhesive becoming in a liquid state.

Thus, in an embodiment of the present invention, an electronic device can be easily peeled off from a porous sheet after when the electronic device is bonded to the porous sheet by the pressure sensitive adhesion. Therefore, if a via contact or wiring is defective, an electronic device can be easily reproduced to be reworked by peeling the defective porous sheet off.

In an embodiment of the present invention, it is very important that an electronic device is mounted on a porous sheet when a wiring and/or via contact is formed and reworked. If a non-porous sheet is applied when a wiring and/or via contact is formed, there is the possibility that a plating and/or etching liquid remains between the electronic device and the sheet. The liquid entering the gap between the electronic device and the sheet cannot easily be washed. However, if the porous sheet is applied, the liquid soaking into the gap between the electronic device and the sheet can be easily washed via the porous sheet. In addition, if the non-porous sheet is applied, bubbles are easy to remain between the electronic device and the sheet. However, if the porous sheet is applied, no bubble remains. Moreover, the porous sheet may be transparent or non-transparent, and is preferably transparent so that the electrode of the electronic device is visible to align the electronic device with an exposure device.

When rework is carried out, if the sheet is not porous, remaining residuals of via contacts are easy to remain on the electrode of the electronic device. In order to form a via contact in a non-porous sheet, a via hole formed in the sheet is plated, or filled with a conductive paste. In this state, the plating metal or conductive paste is simply fitted in the via hole to closely contact only the inner wall of the via hole. Therefore, the bottom of the via contact, i.e. the portion of the via contact connected to the electrode of the electronic device is easy to remain on the electrode during rework. The remaining residuals of the via contact greatly prevents the rework.

On the other hand, in an embodiment of the present invention, a via contact formed in a porous sheet is in a state that the whole via contact is integrated with the porous sheet. Therefore, the remaining residuals of the via contact do not remain on an electrode during rework.

Moreover, in an embodiment of the present invention, a sheet can have flexibility in thickness directions of the sheet since the sheet is a porous sheet. Therefore, the sheet can be closely applied on an electronic device so as to follow irregularities of the electronic device. Of course, there is another advantage in that a via contact can be freely formed in a desired region since a porous sheet is used.

First Embodiment

Referring to drawings, a method for connecting an electronic device according to a first embodiment of the present invention will be described below. FIGS. 1A through 2D are sectional and perspective views showing steps in a method for connecting an electronic device according to a first embodiment of the present invention. In this embodiment, a semiconductor chip is used as an example of an electronic device. FIGS. 1A through 2D are simplified to be shown for explanation. However, of course, the present invention should not be limited to FIGS. 1A through 2D. In FIGS. 1A through 1D, an electrode protruding from the surface of a chip is shown. However, connection can be carried out at the same steps even if the electrode is recessed from the surface of the chip.

Figure 1C:
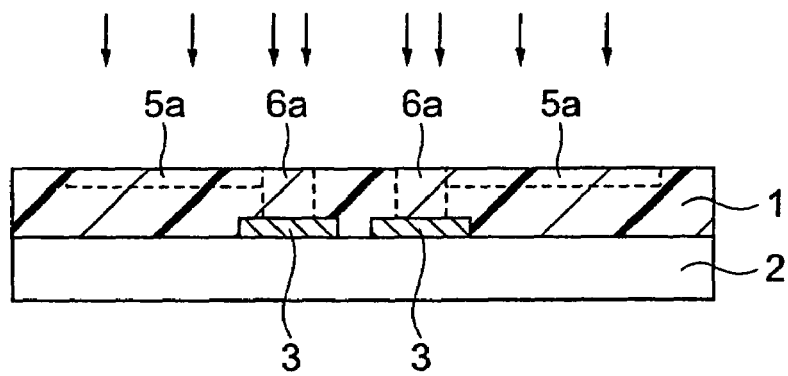
Figure 1D:
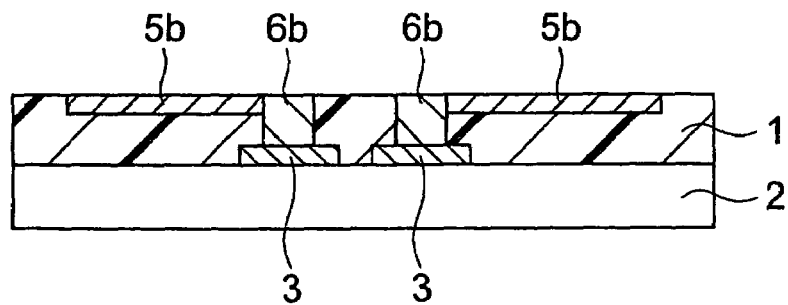
Figure 2A:
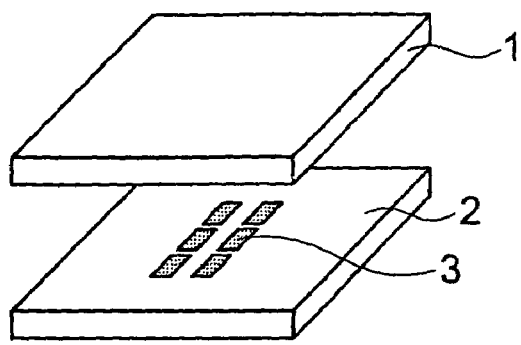
FIGS. 2A through 2D are perspective views showing steps in a method for connecting an electronic device according to the first embodiment of the present invention.
Figure 2B:
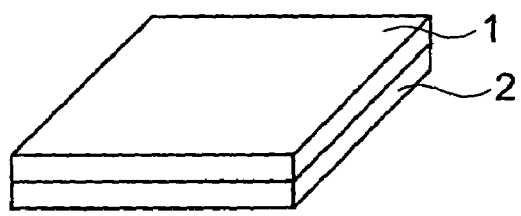

First, a porous sheet 1 being a sheet-like porous member, and a semiconductor chip 2 having electrodes 3 are prepared (see FIGS. 1A and 2A). Subsequently, a surface of the semiconductor chip 2 on which the electrodes 3 are provided is mounted on the porous sheet 1. At this time, the semiconductor chip 2 may be applied and fixed on the porous sheet 1 by the pressure sensitive adhesion (see FIGS. 1B and 2B). By applying the semiconductor chip 2 by the pressure sensitive adhesion, it is possible to prevent the displacement of the semiconductor chip 2 from the porous sheet 1 and the deformation of the porous sheet 1. In addition, since the contact between the electrodes 3 of the semiconductor chip 2 and the porous sheet 1 is improved, it is possible to improve the connection between the electrodes 3 and via contacts which will be described later. Furthermore, the electronic device 2 having the same dimension as that of the porous sheet 1 is shown in FIGS. 1A through 2D, the dimension thereof is not always the same dimension.

Figure 2C:
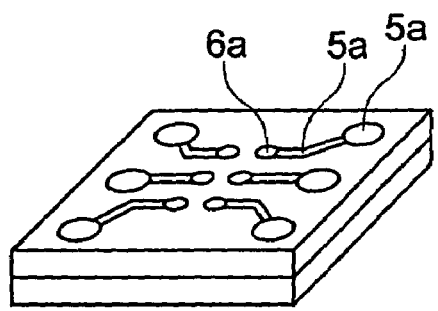

Then, the porous sheet 1 is selectively irradiated with energy beam to carry out the pattern exposure of the porous sheet to form latent images 5a for wiring portions and latent images 6a for via contacts (see FIGS. 1C and 2C). Thereafter, the latent images 5a and 6a are filled with a conductive material by, e.g. plating, to form wiring portions 5b and via contacts 6b (see FIGS. 1D and 2D).

Then, after the wiring portions 5b and via contacts 6b are formed, an examination, such as an electrical continuity test, is carried out. If the examination is passed, the porous sheet 1 is impregnated with a thermosetting resin to be heat-hardened so that the porous sheet 1 is bonded to the semiconductor chip 2 to be integrated and fixed thereto.

If the examination is not passed, the porous sheet 1 is peeled off from the semiconductor chip 2 for a rework, and the semiconductor chip 2 is reproduced (reused). Since the porous sheet 1 is only fixed by the pressure sensitive adhesion, the porous sheet 1 can be easily peeled off without damaging the semiconductor chip 2, and can be reworked. In addition, the semiconductor chip 2 can be connected to the wiring portions 5b and via contacts 6b by using the porous sheet 1, even though the pad pitch of the semiconductor chip 2 is narrow.

Each step will be described in more detail below.

Pressure Sensitive Adhesion Step

A pressure sensitive adhesion step corresponds to FIGS. 1A and 1B and FIGS. 2A and 2B. First, an electronic device is mounted on a porous sheet 1. The electronic device is preferably fixed to the porous sheet 1 by the pressure sensitive adhesion.

The porous sheet 1 thus applied on the electronic device 2 by the pressure sensitive adhesion should not particularly be limited if it has holes therein. In accordance with the use, a porous sheet of an organic or inorganic material may be used.

As the porous sheet of an organic material, a porous sheet of a polymer material may be used. For example, the polymer materials include resins, which are conventionally used as an insulating material for a printed wiring board, such as epoxy resins, bismale imide-triazine resins, PEEK resins and butadiene resins. In addition, the polymer materials include polyolefins, such as polyethylene and polypropylene, polydienes, such as polybutadiene, polyisoprene and polyvinylethylene, acrylic resins, such as polymethyl acrylate and polymethyl methacrylate, polystyrene derivatives, polyacrylonitrile derivatives, such as polyacrylonitrile and polymethacrylonitrile, polyacetals, such as polyoxymethylene, polyesters including polyethylene terephthalate, polybutylene terephthalate and/or aromatic polyesters, polyallylates, aromatic polyamides, such as para- or metha-aramide resins, polyamides, such as nylon, polyimides, aromatic polyethers, such as poly-p-phenylene ether, polyether sulfones, polysulfones, polysulfides, fluorine containing polymers, such as polytetrafluoroethylene, polybenzooxazoles, polybenzothiazoles, polybenzomidazoles, polyphenylenes, such as polyparaphenylene, polyparaphenylene benzobisoxazole derivatives, polyparaphenylene vinylene derivatives, polysiloxane derivatives, novolak resins, melamine resins, urethane resins, and polycarbodiimide resins.

As porous sheets formed of these polymer materials, porous sheets produced by the drawing method or phase transition method are used. Specifically, a draw sheet, such as a polytetrafluoroethylene (PTFE) sheet, and a porous sheet of polysulfone, polyamide or polyimide produced by the phase transition method.

As the porous sheet, there may be used a porous film produced by selectively removing a specific phase from a three-dimensional network microphase separation structure of a block copolymer. Such a porous film is most suitable for the formation of a fine conductive pattern since holes substantially the same diameter in the same sheet.

The method for selectively removing the specific phase from the microphase should not particularly be limited, but an optional method may be adopted. For example, there is used a method for forming a porous structure by removing a decomposed substance by washing with a solvent or the like after decomposing a polymer of a specific phase by ozone oxidation or beta ray irradiation.

The materials of the porous sheet produced from the microphase separation structure include a polycarbooxysilane sheet, a cross-linked polybutadiene sheet and a polycyclohexene sheet. In addition, the specific phase of the microphase separation structure may be thermally decomposed to be volatilized to be removed. By this method, a porous sheet of a heat resistant polymer, such as polyimide, can be produced.

Moreover, a nonwoven fabric wherein polymer microfibers of an aramide resin having a diameter of 1 µm or less are three-dimensionally wound may be used as the porous sheet. However, porous sheet produced by the drawing method, phase transition method or phase separation method are excellent in view of the uniformity of the porous structure, smoothness of the surface, flexibility (cushion property) in thickness directions, and dimensional stability.

On the other hand, the porous sheet of an inorganic material, a porous sheet of a ceramics material is used. The ceramic materials include metal oxides, such as silica, alumina, titania and potassium titanate, silicon carbide, silicon nitride, and aluminum nitride. From these ceramics materials, the porous sheet is produced by the sol-gel method, emulsion templating method or the like.

A porous sheet of a composite material of an organic material and an inorganic material may be used. For example, there is a composite material wherein a fine filler of a ceramics of silica, alumina or montmorillonite is dispersed in a polymer, such as polyamide or polyimide. Such a composite material is preferably used since it has excellent dimensional stability and heat resistance.

The porous structure of the porous sheet is preferably a three-dimensional network porous structure wherein branching continuous holes having open ends to the outside of the sheet are uniformly formed in the sheet. The conductive material impregnated and filled in the three-dimensional network porous structure is suitably held and fixed since the conductive material is three-dimensionally continuous in the sheet. In addition, the holes filled with the conductive material are not only continuous in the thickness directions of the porous sheet, but they are continuous in the horizontal directions thereof. Therefore, it is not only possible to form both via contacts and wiring portions, but it is also possible to obtain a good conductivity.

Furthermore, such effects cannot be expected in honeycomb-like porous sheets having no three-dimensional continuous holes or in a mesh-like sheets formed by plain-weaving fibers. For example, in a plain woven mesh sheet disclosed in Japanese Patent Laid-Open No. 10-321989, continuity can be slightly ensured in horizontal direction, but conductivity in horizontal directions of most of the sheet must be ensured on the top and bottom of the sheet. Therefore, irregularities are formed in conductive pattern portions and non-conductive portions. For that reason, it is difficult to carry out lamination, and high frequency characteristics are bad since the thickness of insulating layers between layers is not constant. In addition, the via contacts and wiring portions are scaled down, it is difficult to form small-diameter via contacts since the conductive pattern size is substantially the same as the diameter of fibers. Also in the case of nonwoven fabric, there is the same problem as that in the honeycomb-like porous sheet or mesh-like sheet, since a usual nonwoven fabric is formed of fibers having a diameter of about 10 µm or more. Particularly, it is very difficult to form a three-dimensional fine wiring structure of via contacts and wiring portions.

Such problems can be eliminated by using a porous sheet having three-dimensional continuous holes having a diameter which is sufficiently smaller than the conductive pattern size, preferably one-ten or less of the conductive pattern size.

The hole rate of a porous sheet used in an embodiment of the present invention is preferably in the range of from 40% to 95%, more preferably in the range of from 50% to 85%. If the hole rate is too large, the mechanical strength and dimensional stability of the porous sheet are not sufficient. On other hand, if the hole rate is too small, it is difficult to fill the conductive material, so that it is difficult to ensure a sufficient conductivity. The hole rate can be measured by observing the sheet by means of an electron microscope. The hole rate may be calculated by obtaining the specific gravity of the porous sheet.

The mean hole diameter of the holes in the porous sheet is preferably in the range of from 0.05 µm to 5 µm, more preferably in the range of from 0.1 µm to 0.5 µm. If the hole diameter is too large, it is difficult to form fine via contacts and wiring portions. Particularly, if ultraviolet or visible rays are used as energy beams, great scattering occurs, so that it is not possible to expose a fine pattern. On the other hand, if the hole diameter is too small, it is difficult to fill the conductive material. In addition to the hole diameter, the pitch size of the holes is also important. If a large pitch portion, i.e. a non-hole portion, exists, large scattering of light occurs from the portion, so that it is difficult to carry out exposure while controlling the shape to inside of the porous sheet. The radius of gyration of the non-hole portion is preferably 10 µm or less, more preferably 5 µm or less. Preferably, the non-hole portion is uniformly dispersed without being localized. The mean hole diameter and the radius of gyration of the non-hole portion can be measured by the light-scattering method or X-ray scattering method.

The thickness of the porous sheet is ten times or more, preferably 50 times or more, as large as the mean hole diameter. If the thickness of the sheet is too small as compared with the hole diameter, the shape of the conductive portion to be formed is easily disturbed in thickness directions, so that the electric characteristics of the via contacts and wiring portions are deteriorated. The conductive material filled in the holes is collectively formed in the conductive portion. If the hole diameter is too large as compared with the thickness of the sheet, it is difficult to form the shape of the conductive portion in thickness directions with a good resolution. Particularly, if a sheet has both via contacts passing through the sheet and wiring portion which do not pass through the sheet, the hole diameter must be sufficiently smaller than the thickness of the sheet.

In addition, if the hole diameter is too large as compared with the thickness of the sheet, the flexibility of the sheet is insufficient in thickness directions, and the surface of the sheet does not sufficiently follow the surface irregularities of the electronic device.

The preferred thickness of the porous sheet is suitably determined in accordance with the relationship to the above described hole diameter, and the number of wiring layers formed in a single sheet. If a single sheet has wiring portions and via contacts passing through the sheet in thickness directions, the thickness of the sheet is preferably in the range of from 5 µm to 30 µm. If the sheet is too thin, it is difficult to handle the sheet, and it is not possible to sufficiently ensure the insulation between wiring layers. On the other hand, if the sheet is too thick, it is difficult to form via contacts and wiring portions passing through the sheet in thickness directions. If a single sheet has a wiring layer and a via contacts for connecting the wiring layer to an electrode, the thickness of the porous sheet is preferably in the range of from 10 µm to 20 µm, more preferably in the range of from 40 µm to 100 µm.

The electrodes 3 of the electronic device 2 is mounted so as to face the porous sheet 1 having holes as mentioned above (see FIGS. 1B and 2B). At this time, the electronic device 2 is preferably fixed to the porous sheet 1 by the pressure sensitive adhesion. At this time, the surface of the electronic device can have a pressure sensitive adhesion by applying an pressure sensitive adhesive. Alternatively, a porous sheet 1 having pressure sensitive adhesion on the surface thereof may be used. The pressure sensitive adhesion is preferably given to the porous sheet 1 since the electronic device 2 is easily held to be clean during a rework. In the case of the porous sheet 1 having the pressure sensitive adhesion, at least the surface of the porous sheet 1 applied on the electronic device 2 may be pressure sensitive adhesive, and one side of the porous sheet is usually pressure sensitive adhesive.

The pressure sensitive adhesive used in the case of the pressure sensitive adhesion should not particularly be limited, but well-known pressure sensitive adhesives maybe widely used. For example, there may be used acrylic, silicone, polyvinyl ether, polyvinyl acetate resin, rubber, and urethane adhesives. In addition, hot melt type pressure sensitive adhesives, such as styrene adhesives, may be used. Acrylic adhesives and silicone adhesives are excellent in view of heat resistance. Particularly, acrylic adhesives having an excellent solvent resistance may be used.

For example, the acrylic pressure sensitive adhesive may be an adhesive wherein a composition of a cross-linking polymer and across-linking agent is applied. If necessary, a pressure sensitive adhesion applying agent or the like maybe added. The cross-linking polymer may be a copolymer including across-linking monomer. The copolymer is formed by suitably combining and copolymerizing three kinds of monomers of main monomers, sub-monomers and cross-linking monomers. The copolymer may be a random copolymer, a block copolymer or a graft copolymer. As the main copolymer, there is usually used an acrylic alkylester or methacrylic alkylester wherein the glass-transition temperature Tg of a homopolymer is −50° C. or lower. As the acrylic alkylester, there is used an acrylic alkylester having an alkyl group having four to ten carbon atoms. For example, there may be used n-butyl acrylate, isobutyl acrylate, isooctyl acrylate, 2-ethylhexyl acrylate, isononyl acrylate and decyl methacrylate.

At the sub-monomer for adjusting characteristics, there is used a monomer which can be copolymerized with the main monomer and which can increase the glass-transition temperature Tg. For example, there are used acrylic esters of lower alkyl groups, such as ethyl acrylate, methacrylates, such as methyl methacrylate, styrene, vinyl acetate, and acrylonitrile. These sub-monomers can enhance cohesion and improve characteristics, such as pressure sensitive adhesion.

In order to give water solubility, acrylic acid, methacrylic acid, N-vinylpyrolidone, acrylic amide, 2-hydroxyethyl acrylate, or ethylacrylate may be copolymerized. As the cross-linking monomer, there is used a monomer having carboxyl, hydroxy, epoxy, amino and amide groups which can be mutually cross-linked by a cross-linking agent. The cross-linking agent has the function of mutually cross-linking the cross-linking polymer to enhance the cohesion of the pressure sensitive adhesive.

Examples of cross-linking monomers having a carboxyl group include acrylic acid, methacrylic acid and itaconic acid, and examples of cross-linking agents combined therewith include epoxy resins, melamine resins, urea resins and polyisocyanates.

Examples of cross-linking monomers having a hydroxy group include hydroxyethyl acrylate, hydroxypropyl acrylate, hydroxyethyl methacrylate, hydroxypropyl methacrylate and N-methylol methacrylic acid, and examples of cross-linking agents combined therewith include epoxy resins, polyisocyanates, dialdehyde and methylol polymer.

Examples of cross-linking monomers having an epoxy group include glycidyl arcylate and glycidyl methacrylate, and examples of cross-linking agents combined therewith include acid catalysts, aluminum silanol catalysts, acid anhydrides, amines and amine acids.

Examples of cross-linking monomers having an amino group include dimethyl aminoethyl methacrylate, and tert-butyl aminoethyl methacrylate, and examples of cross-linking agents combined therewith include epoxy resins, polyisocyanates and dialdehyde.

Examples of cross-linking monomers having an amide group include acrylic amide and methacrylic amide, and examples of cross-linking agents combined therewith include epoxy resins, melamine resins and urea resins.

Examples of other cross-linking agents include metallic salts and metal chelates. Examples of the pressure sensitive adhesives applying agents include polyhydric alcohols and ethylene oxide addition products, e.g. rosin, coumarone-indene, terpene, petroleum and phenol pressure sensitive adhesion applying resins.

The porous sheet 1 used in an embodiment of the present invention preferably has pressure sensitive adhesion on at least one surface thereof, and has a specific photosensitive layer on the surface in holes. Of course, the porous sheet 1 itself may be photosensitive. However, since absorption of exposure light becomes strong, it is difficult to suitably carry out exposure inside of the porous sheet. Therefore, a photosensitive layer is preferably formed on the surface in holes of the porous sheet 1 without closing the holes.

The photosensitive layer of the porous sheet 1 in an embodiment of the present invention will be described in detail below. In addition to a photosensitive layer which will be described in detail below, a photosensitive layer of a photosensitive material proposed by the inventors in Japanese Patent Application No. 2002-46321 may be used.

The photosensitive layer formed on the surface in holes of the porous sheet 1 may have a photosensitive group which produces or eliminates an ion-exchange group. The photosensitive layer may consist of a photosensitive molecule having a photosensitive group, but it may be a mixture thereof with other compounds. By irradiating energy beams in a desired pattern of such a photosensitive layer including a photosensitive group, an ion-exchange group is produced or eliminated in or from the irradiated region.

Throughout the specification, the ion-exchange group means a group capable of absorbing ions by an ion exchange reaction, or a group which is ionized to be a group capable of absorbing ions by an ion exchange reaction.

The photosensitive group may be a group which absorbs irradiated energy beams to cause a chemical reaction alone to produce an ion-exchange group. Alternatively, the photosensitive group may be a group which produces an ion-exchange group by a multistage reaction with a chemical reaction based on irradiation with energy beams as a start. Such a photosensitive group first causes a chemical reaction by irradiation to produce a precursor of an ion-exchange group. Then, this precursor causes a chemical reaction with a surrounding material to produce an ion-exchange group. Alternatively, the photosensitive group may be a group which acts with an acid or the like, which is produced from a photo acid producing agent by irradiation with energy beams, to produce an ion-exchange group.

The photosensitive groups absorbing energy beams to produce an ion-exchange group alone, or the photosensitive molecules having a photosensitive group include o-nitrobenzyl ester derivatives, p-nitrobenzyl ester sulfonate derivatives, and naphthyl or phthalimide trifluorosulfonate derivatives of carboxylic acids, sulfonic acids or silanol. Moreover, peroxide esters, such as peroxides of tert-butyl esters of carboxylic acids, may be used. If peroxide esters are irradiated with energy beams, a carboxyl group of an ion-exchange group is produced. The peroxide esters produce radicals together with the ion-exchange group by irradiation with energy beams. The radicals are greatly useful since they have the function of cross-linking the photosensitive molecule to improve the solvent resistance of the photosensitive layer.

As the compound producing an ion-exchange group by a multistage reaction with a chemical reaction based on irradiation with energy beams as a start, there are quinone diazides. Quinone diazides are irradiated with energy beams to produce a ketene intermediate, which subsequently reacts with water to be changed to an indene carboxylic acid. After such stages, a carboxyl group is produced. Specifically, there are o-quinone diazide derivatives, such as benzoquinone diazides, naphthoquinone diazides and anthraquinone diazides.

As examples of the group acting with an acid or the like, which is produced from a photo acid producing agent by irradiation with energy beams, to produce an ion-exchange group, there is a group wherein a protective group is introduced into an ion exchange group, such as a carboxyl group, a phenol hydroxyl group or a silanol group. If this photosensitive group is used, a photo acid producing agent which produces an acid by irradiation with energy beams is added. By irradiating with energy beams, an acid is produced from the photo acid producing agent to decompose the protective group to produce an ion exchange group. The protective groups of carboxyl groups include tert-butyl group, tert-butoxycarbonyl group, and acetal groups, such as tetrahydropyranyl group. The protective groups of phenolic hydroxyl groups and silanol groups include tert-butoxycarbonyl group which is used as tert-butoxycarbonyloxy group.

Photo acid producing agents suitable for deprotection of such protective groups include salts, such as onium, diazonium, phosphonium and iodonium salts, which have counter anions, such as $CF_3SO_3^-$, $p\text{-}CH_3PhSO_3^-$ and $p\text{-}NO_2PhSO_3^-$, triazines, organic halogen compounds, 2-nitrobenzyl sulfonates, iminosulfonates, N-sulfonyloxyimides, sulfonyl sulfones, and quinine diazide sulfonates.

Specifically, the photo acid producing agents include triphenyl sulfonium trifurate, diphanyl iodonium trifurate, 2,3,4,4-tetrahydroxybenzophenone-4-naphthoquinone diazide sulfonate, 4-N-phenylamino-2-methoxyphenyl diazonium sulfate, diphenylsulfonyl methane, diphenyl sulfonyl diazomethane, diphenyl disulfone, α-methylbenzoin tosylate, pyrogallol trimesilate, benzoin tosylate, naphthal imidyl trifluoromethane sulfonate, 2-[2-(5-methyl furan-2-il) ethenyl]-4,6-bis (trichloromethyl)-s-triazine, 2-[2-(furan-2-il) ethenyl]-4,6,-bis (trichloromethyl)-s-triazine, 2-[2-(4-diethyl amino-2-methylphenyl) ethenyl]-4,6-bis (trichloromethyl)-2-triazine, 2-[2-(4-diethyl aminoethyl) amino]-4,6-bis (trichloromethyl)-s-triazine dimethyl sulfate, 2-[2-(3,4-dimethoxyphenyl) ethenyl] 4,6-bis (trichloromethyl)-s-triazine, 2-(4-dimethoxyphenyl)-4,6-bis (trichloromethyl)-s-triazine, 2-methyl-4,6-bis (trichloromethyl)-s-triazine, and 2,4,6-tris (trichloromethyl)-s-triazine. These photo acid producing agents may be combined with acid producing agents which newly autocatalytically produce an acid with an acid.

As examples of materials producing an ion-exchange group, acid productive polymer, which newly autocatalytically produces acid group serving as an ion exchange group by an acid of a polymer having 2-hydroxybicyclo alkane-1-sulfonate residue as a side chain, may be combined with a photo acid producing agent.

The photosensitive group, which eliminates an ion exchange group by irradiation with energy beams, is a group which has an ion exchange group before irradiation and wherein the ion exchange group is eliminated or changed to a hydrophobic group by irradiation with energy beams. Specifically, there is a carboxyl group derivative group capable of causing a decarboxylation reaction to be decomposed. The carboxyl group derivative group is preferably a group which causes a decarboxylation reaction with a basic compound. Such groups include a group which has an electron attractive group or unsaturated bond at α or β position of a carboxyl group. The electron attractive group is preferably carbonyl, cyano, nitro, aryl or carbonyl group, or halogen.

Examples of such carboxyl group derivative groups or photosensitive compounds including such carboxyl group derivative groups include α-cyanocarboxylic acid derivatives, α-nitrocarboxylic acid derivatives, α-phenylcarboxylic acid derivatives, β,γ-olefin carboxylic acid derivatives, and indene carboxylic acid derivatives. When a photo base producing agent is used as the basic compound, a base is produced by irradiation with energy beams, and carboxyl group is decarboxylated to be eliminated by the produced base.

The photo base producing agents include cobalt amine complex, ketone oxime esters, o-nitrobenzyl carbamates and formamides. Specifically, for example, carbamates, such as NBC-101 (CAS. No. [119137-02-0]) produced by Midori Kagaku, may be used. Moreover, triaryl sulfonium salts, such as TPS-OH (CAS. No. [58621-56-0]) produced by Midori Kagaku, may be used.

In place of the photo base producing agent, a photo acid producing agent and a basic compound may be combined to be used. In this case, in a region irradiated with energy beams, an acid, which is produced from the photo acid producing agent, neutralizes the basic compound. On the other hand, in a region, which is not irradiated with energy lines, the basic compound acts on a carboxyl group containing compound to cause a decarboxylation reaction to eliminate a carboxyl group. Thus, the carboxyl group can be selectively arranged only at the irradiated region.

The basic compound to be added may be an optional compound which is neutralized with an acid emitted from the photo acid producing agent and which acts as a catalyst for the decarboxylation reaction of the carboxyl group containing compound. This basic compound may be an organic or inorganic compound, and is preferably a nitrogen containing compound. Specifically, the basic compounds include ammonia, primary amines, secondary amines and tertiary amines. The content of these photo base producing agents and basic compounds is in the range of from 0.1% to 30% by weight, preferably in the range of from 0.5% to 15% by weight, in the photosensitive composition. If it is less than 0.1% by weight, the decarboxylation reaction dose not sufficiently proceed, and if it exceeds 30% by weight, there is the possibility that the deterioration of the carboxyl group derivative group remaining in the unexposed portion is promoted.

When the photo acid producing agent is combined with the basic compound, of course, the amount of the acid capable of being produced from the photo acid producing agent is greater than the amount of the base of the basic compound. Specifically, the amount of the acid is preferably one or more equivalent, more preferably 1.2 equivalent or more. The equivalent is an amount expressed by the following expression.

Equivalent=(mole of photo acid producing agent× number of acids produced from one molecule of photo acid producing agent×valence of produced acid)÷(mole of basic compound×valence of basic compound)

The photosensitive layer may be formed by coating the surface in holes of the porous sheet with a photosensitive molecule having a photosensitive group or with a photosensitive composition containing a photosensitive molecule. Alternatively, the photosensitive layer may be formed by chemically bonding a photosensitive molecule on the surface in holes, like a silane coupling agent. Moreover, the photosensitive layer may be formed by reforming the surface in holes by a chemical reaction. For example, the surface in holes may be coated with a photosensitive graft polymer chain having a photosensitive group caused to grow from a point of growth, which is formed on the surface in holes, by the graft polymerization method. Moreover, the photosensitive group may be formed by chemically modifying a functional group, such as a sulfonic group, which is introduced by the Friedel-Crafts' reaction or the like on the surface in holes of a polymer porous sheet having an aromatic ring, such as a polyimide porous sheet. The photosensitive layer is most preferably formed by coating the surface in holes of the porous sheet with a photosensitive material of a photosensitive molecule or photosensitive composition, since the material of the porous sheet can be widely selected and since the photosensitive layer can be easily formed. In the coating, a porous sheet may be impregnated with a solution of a photosensitive material to be dried. When a solution of a photosensitive material is used, the solution is preferably diluted so as not to close holes of the porous sheet.

Furthermore, when the photosensitive layer is formed of a material having pressure sensitive adhesion, the photosensitive layer can also serve as a pressure sensitive adhesive for applying pressure sensitive adhesion to the surface of the porous sheet. In order to apply pressure sensitive adhesion to the photosensitive layer, a material having pressure sensitive adhesion may be used as the photosensitive molecule, or a pressure sensitive adhesive may be mixed with a photosensitive molecule. Alternatively, a high boiling solvent or a plasticizer may be added to a photosensitive molecule to apply pressure sensitive adhesion.

The photosensitive molecule is preferably a molecule having a photosensitive group supported on or bonded to a macromolecule, such as a polymer. More preferably, the photosensitive molecule is a molecule wherein a group for producing an ion exchange group is chemically bonded to a macromolecule, such as a polymer, by covalent bond. If the photosensitive molecule is a macromolecule, such as a polymer, the porous sheet is easily coated with the photosensitive molecule, and the photosensitive layer has an excellent resistance to the solvent. In addition, if the photosensitive layer is suitably swelled by a solution which is used when absorbing a plating nucleus, the amount of the plating nucleus to be absorbed per unit area can be increased. The polymer chain, into which the photosensitive group and cross-linked group are introduced, is suitably applied as a solution and has an excellent resistance to acid and alkali, a high adhesion to a base, and an excellent heat resistance. In view of the foregoing, examples of preferable polymer chains are as follows.

That is, there are novolak resins and their derivatives, polyacrylic esters and their derivatives, polystyrene derivatives, copolymers of styrene derivatives and maleinimide derivatives, polynorbornenes and their derivatives, polycyclohexenes and their derivatives, polycyclohexanes and their derivatives, polyphenylenes and their derivatives, silicone resins, polyamides, polyimides, and polyarylates.

Among them, novolak resins, such as phenol novolak and cresol novolak, silicon resins, polyacrylic ester derivatives are preferably used.

When the amount of the ion exchange group introduced into the polymer is too small, it is difficult to sufficiently absorb metal ions and/or metal colloids. On the other hand, when the introduced rate is too large, the polymer is easily soluble in a plating solution, and a produced package wiring portion is easy to absorb moisture, so that failure, such as insulation failure, is easy to occur. In view of the foregoing, the amount of the group, which produces or eliminates the ion exchange group, to be introduced into the polymer is preferably in the range of from 5% to 300%, more preferably in the range of from 30% to 70%. The introduced rate herein is expressed by the following expression.

Introduced rate (%)=(Number of groups producing or eliminating ion exchange group)÷(number of monomers of polymer)×100

The molecular weight of the polymer into which the photosensitive group is introduced should not particularly be limited. The weight average molecular weight of the polymer is preferably in the range of from 500 to 5,000,000, more preferably in the range of from 1500 to 50,000. If the molecular weight of the polymer is too small, the deposition performance is bad, so that there is the possibility that the solvent resistance of the polymer to the plating solution or the like deteriorates. On the other hand, if the molecular weight of the polymer is excessively great, the solubility of the polymer in the solvent for application deteriorates, and the application performance thereof also deteriorates. In order to improve the solvent resistance, the photosensitive molecule may be mutually cross-linked with a photosensitive molecule by adding a cross-linking agent or the like.

In the case of a porous sheet having no pressure sensitive adhesion on the surface thereof, after the above described pressure sensitive adhesive is applied on the surface of the electron device or porous sheet, it is pressed to be fixed thereon by the pressure sensitive adhesion.

Energy Beam Irradiation Step

Then, as shown in FIGS. 1C and 2C, a predetermined region of the porous sheet 1, on which the electronic device 2 is mounted, is selectively irradiated with energy beams. In the irradiated portion or non-irradiated portion of the porous sheet 1, conductive portion forming regions are obtained as latent images 5a and 6b. At a conductive portion forming step which will be described later, this conductive portion forming region is selectively filled with a conductive material to form package wiring portions, such as via contacts and wiring portions, in the porous sheet 1.

An embodiment of the present invention is characterized in that a conductive material is impregnated to be filled in the porous sheet 1 without newly forming holes for filling the conductive material. A method for forming the conductive portion forming region in the porous sheet 1 to selectively fill the region with the conductive material should not particularly be limited, but well-known methods may be widely used. For example, the conductive portion forming region may be produced by irradiating with energy beam to change the permeability of the conductive material in the irradiated region. In this case, the conductive portion forming region can be obtained by using a porous sheet, which is processed by the water repellent finishing with a fluorine containing finishing agent, for irradiating its desired region with energy lines to remove the fluorine containing finishing agent. If this porous sheet is dipped in a conductive polymer solution, such as sulfonated polyaniline aqueous solution, at the conductive portion forming step which will be described later, the conductive polymer solution is impregnated only in a region from which fluorine is removed. Thereafter, if this is dried, only the region from which fluorine is removed can be selectively conductive by the conductive polymer.

Alternatively, when a PTFE porous sheet impregnated with a hydrophilic solution is used as described in, e.g. Japanese Patent Laid-Open No. 6-293837, the conductive portion forming region can be obtained by irradiating a predetermined region with ultraviolet to selectively make the exposed portion hydrophilic. Thereafter, if the sheet is impregnated with a solution of a conductive polymer in the same manner as the above described manner, the irradiated portion can be selectively impregnated with the conductive polymer.

Moreover, the conductive portion forming region may be produced by causing a catalyst for the CVD (Chemical Vapor Deposition) or electroless plating to be selectively produced in or absorbed into a desired region. Alternatively, the catalyst may be selectively produced in or absorbed into the exposed or non-exposed portion by reforming the surface in holes of the porous sheet by irradiation with energy beams. In this case, the catalyst producing portion or catalyst absorbing portion may be filled with a conductive material, such as a metal, by the CVD or electroless plating method.

Alternatively, a solution of a conductive material, or a dispersing solution of ultra-fine particles of a conductive material may be printed on the porous sheet by an ink jet method or the like. For example, a paste of metal fine particles having a diameter of about a few nanometer to about tens nanometer may be used. Similarly, after a solution containing a catalyst for electroless plating or the like may be printed by an ink jet method, a conductive material may be selectively deposited on a portion, to which the catalyst adheres, by electroless plating or the like.

The pattern plating methods proposed by the inventors in Japanese Patent Application Nos. 2000-159163, 2001-92715 and 2002-46321 are most preferably used since they are easy processes and since they can form fine and high precision via contacts and wiring portions. In these cases, the above described porous sheet wherein the above described photosensitive layer is formed on the surface in holes is used. By irradiating a predetermined region of such a porous sheet with energy beams, the ion exchange group of the exposed portion is produced or eliminated. Subsequently, at the conductive portion forming step, the plating nucleus is selectively absorbed into a region in which the ion exchange group exists, and this is electroless-plated to form conductive portions, such as via contacts and wiring portions.

The porous sheet 1, on which the electronic device 2 is mounted by the pressure sensitive adhesion or the like, may be impregnated with a solution of a photosensitive material, which is applied thereon, to form a photosensitive layer. However, if the sheet is thus impregnated with the solution of the photosensitive material to be dried after the electronic device 2 is mounted, a large amount of photosensitive material is easily applied in the vicinity of the sticking surface of the porous sheet 1 on the electronic device 2, and it is difficult to uniformly form the photosensitive layer. In order to uniformly form the photosensitive layer, a porous sheet 1 on which the photosensitive layer is previously formed is preferably used.

The irradiated energy beams for pattern exposure include ultraviolet, visible light, infrared, electron beams and X-rays. Ultraviolet and visible light are excellent since they are inexpensive and it is easy to carry out pattern exposure for selectively irradiating a desired region. The pattern exposure can be carried out via an exposure mask having a predetermined pattern, or by scanning energy beams, such as laser beams. Alternatively, the pattern exposure may be carried out by means of a laser diode array. Moreover, light from a light source may be modulated by a micro mirror array to carry out exposure. The micro mirror array is a light modulating device wherein a large number of micro mirrors being fine mirrors are arranged in the form of a matrix. For example, ten thousands to several millions or more square micro mirrors with sides of about 5 μm to 20 μm long are arranged in the form of a matrix. The angle of each of the micro mirrors can be separately changed. Therefore, one mirror serves as one picture element, and the angle of each mirror is modulated to form an exposure pattern in accordance with a wiring and/or via pattern to be exposed. The wiring and/or via pattern can be exposed on the porous sheet with the need of any masks. As an example of such a micro mirror array, there is a digital micro mirror device produced by Texas Instruments, Inc. (Dallas, Tex., USA).

In addition, for example, each of picture elements may comprise a plurality of rows of electrodes with mirror finished surface, the picture elements being recessed on alternative rows to serve as a diffraction grating, and a light modulating device for changing the on/off of light may be used. Alternatively, maskless exposure may be carried out by means of various well-known light modulating devices, such as a light modulating device using a liquid crystal.

The porous sheet may be exposed so that all of the two-dimensional patterns of the wiring portion and/or via contact pass through the sheet in thickness directions. Exposure may be three-dimensionally carried out in the porous sheet.

The three-dimensionally exposing method should not particularly be limited. For example, the focal point of laser beams may be three-dimensionally scanned in the porous sheet. Alternatively, even if exposure is carried out by means of an exposure mask having a two-dimensional pattern, exposure can be three-dimensionally carried out by adjusting light exposure or by selecting exposure wavelength. For example, if the via portion passes through the sheet in thickness direction and if exposure is carried out only in the vicinity of the surface of the wiring portion, both of the wiring portion and the via portion for connecting the wiring portion to the electrode of the electronic device can be made in a single porous sheet. For example, in order to adjust light exposure, there may be used a mask, such as a halftone mask, wherein the transmittance is adjusted in the via and wiring portions. For example, a method described in Japanese Patent Application No. 2001-170018 may be used, the entire contents of which are incorporated by reference. In addition, a light modulation device, such as the above described micro mirror array, may be used. By using a micro mirror array, the shape of an exposure pattern is changed during exposure. For example, in the case of the use of a porous sheet wherein a photosensitive layer for producing an ion exchange group by exposure is formed, the sheet is first exposed by an exposure pattern including both of a via portion and a wiring portion, and then, it is exposed by an exposure pattern including only the via portion. Then, the light exposure in the via portion can be easily greater than that in the wiring portion. The exposure pattern may be changed any time, not only one time. For example, the wiring and via patterns are alternately irradiated for a short time to be repeated. Then, the ratio of the total of the respective irradiation times is set to be a required ratio of light exposure. Thus, exposure for the via pattern and exposure for the wiring pattern are substantially simultaneously completed, so that the displacement of the via and wiring portions can be more decreased.

In addition, even if the via and wiring portions are differently made, if the exposure pattern is changed at any times during exposure, the light exposure can be finely adjusted in accordance with the shape of the pattern. For example, when two wiring layers are made in the surface and reverse of a single porous sheet, a portion in which the wiring layers on the surface and reverse cross three-dimensionally is excessively exposed. Also between close patterns, there is the proximity effect of exposure pattern with respect to light exposure that exposure is easily excessive. In such a case, if a micro mirror array is used, it is easy to decrease light exposure in, e.g. a three-dimensionally crossing portion.

In addition, for example, three-dimensional exposure may be carried out by changing exposure wavelength in wiring and via portions. That is, there is used a porous sheet capable of strongly absorbing ultraviolet light having a wavelength of about 190 nm to about 350 nm as a primary exposure light. As an example of such a porous sheet, there is an aromatic polyimide porous sheet. As an example of secondary exposure light, there is used visible light having a wavelength of about 550 nm to 800 nm which is hardly absorbed into the porous sheet. The wiring portion is exposed to the primary exposure light. Since the primary exposure light is strongly absorbed into the porous sheet, exposure is not carried out up to inside of the porous sheet, and only the vicinity of the surface is exposed to be a wiring pattern. The via portion is exposed to the secondary exposure light. The second exposure light passes through the porous sheet to the reverse to form a via pattern. The sheet may be simultaneously or sequentially irradiated with the first and secondary exposure lights. When the sheet is sequentially irradiated, the micro mirror array is preferably used. The exposure pattern of the micro mirror array is changed when the wiring pattern is exposed and when the via pattern is exposed. As the light source, two kinds of light sources may be prepared, or an optical filter, such as a band pass filter, may be used for changing wavelength.

Figure 3:
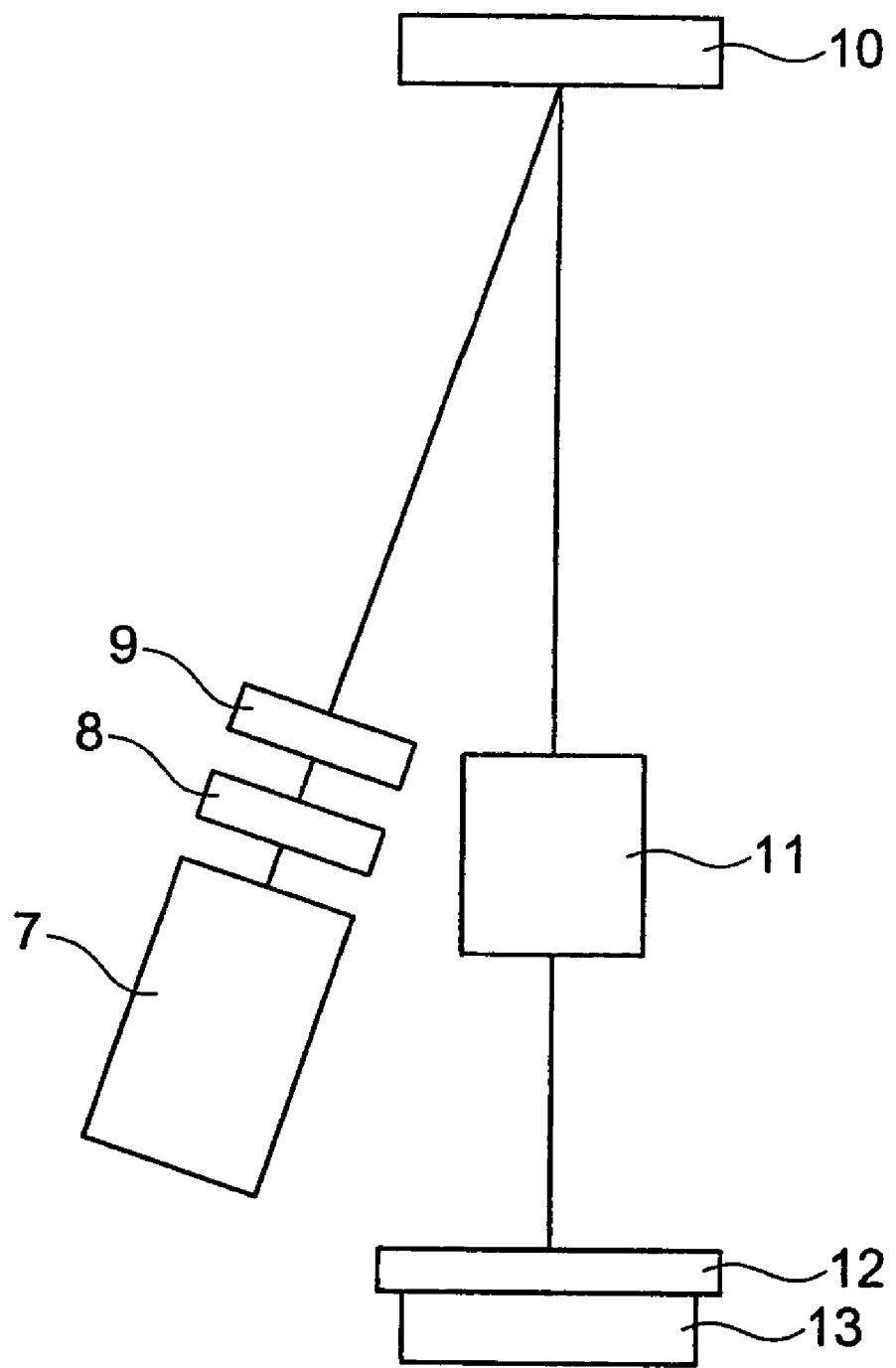
FIG. 3 is a block diagram showing an exposure device using a micro mirror array.

FIG. 3 shows an example of an exposure device using a micro mirror array 10. Light emitted from an exposure light source 7 passes through an optical filter 8 and a shutter 9 to enter the micro array 10. Exposure light selectively reflected on each micro mirror of the micro mirror array 10 passes through a projection lens 11 to enter a porous sheet 12 which is arranged on an electronic device 13. There may be provided a sensor (not shown), such as a CCD camera or an X-ray camera, for reading an electrode pattern of an underlying electronic device. This sensor may read the electrode pattern of the electronic device 13 to finely control a pattern, which is produced by the micro mirror array 10, so as not to cause a displacement from the exposure pattern.

If both of via and wiring portions are thus made by three-dimensional exposure, it is difficult to cause the displacement between the via and wiring portions. Therefore, the land for absorbing displacement is not required, and landless via can be provided, so that it is possible to increase the density of the wiring pattern. In addition, if the micro mirror array is used for carrying out the alignment of the exposure pattern with the electrode pattern of the electronic device as described above, it can be difficult to cause the displacement from the electrode of the electronic device. Moreover, since the wiring and via portions are integrally formed in the porous sheet, the wiring and via portion are connected to each other by the porous structure. Therefore, it is difficult to cause failure, such as break in the connecting portion of the wiring portion to the via portion. Generally, in a wiring board bonded to an electronic device, such as a semiconductor chip, thermal stress caused by the difference in thermal expansion coefficient between the electronic device and the board is easy to cause failure that the connecting portion of the via portion to the wiring portion is broken. On the other hand, according to the present invention, it is possible to provide a package wherein it is difficult to cause such failure and which has high reliability.

Moreover, if three-dimensional exposure is carried out, the connecting portion of the via portion to the wiring portion can be formed so as to have a smooth curve. Therefore, it is possible to improve reliability, such as electric characteristics and the bonding strength between the via portion and the wiring portion. That is, as described above, if adjacent patterns are close to each other, the close portion is excessively exposed so that the pattern is easily expanded. In the connecting portion of the via portion to the wiring portion, the side of the via portion is very close to the bottom of the wiring portion. Therefore, if the proximity effect is positively used, the via portion having such a shape as to trail its skirt can be smoothly bonded to the wiring portion in the connection portion. The control of the shape by such a proximity effect has a sufficient resolution in thickness directions. That is, this can be achieved only by adopting a method for using a porous sheet having a sufficiently greater thickness than the diameter of holes and for selectively filling a conductive material in latent images which are formed by irradiation with energy beams.

Conductive Portion Forming Step

Figure 2D:
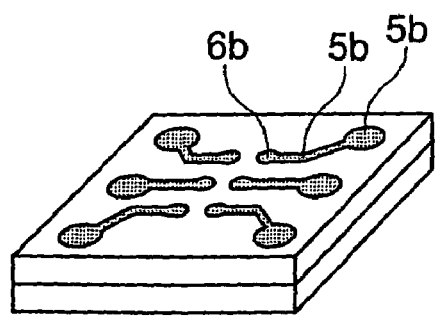

As shown in FIGS. 1D and 2D, a conductive material or its precursor is selectively filled in holes of the exposed or unexposed portion of the porous sheet 1 after pattern exposure to form package wiring portions, such as wiring portions 5b and via contacts 6b. The porous sheet is impregnated with the filled conductive material so that the conductive material is integrated with the porous structure. The conductive materials filled in the porous sheet 1 include metals, such as copper, nickel, gold and silver, their alloys, conductive ceramics, such as indium tin oxide and zinc oxide, carbon materials, such as graphite, highly doped silicon, and conductive polymers, such as polyaniline derivatives, polythiophene derivatives and polypyrrole derivatives. The method for impregnating and filling a desired region of the porous sheet with these conductive materials should not particularly be limited, but the pattern plating method as described with respect to the energy irradiation step is preferably used since it is possible to achieve the scale-down of the pattern and since it is possible to form a good pattern up to inside of the porous sheet.

That is, the photosensitive layer for producing and eliminating the ion exchange group by irradiation with energy beams is previously formed on the surface in holes of the porous sheet, and pattern exposure is carried out so that the ion exchange group is arranged in a specific region in the form of a pattern. The pattern of the ion exchange group thus obtained is caused to absorb metal ions to form a conductive portion forming region. If necessary, the metal ions may be reduced to be metal fine particles. If electroless plating is carried out thereon, these metal ions and/or metal fine particles act as a catalyst for plating to be plated in the form of a pattern to form a conductive portion. If the porous sheet is irradiated with energy beams so that the energy beams pass through the porous sheet in thickness direction, it is possible to form a via portion being a conductive pattern passing through the sheet in thickness directions. By the same method, it is also possible to form a wiring portion passing through the sheet in thickness direction. If only the vicinity of the surface of the porous sheet is irradiated with energy beams, it is possible to form wiring, pad and ground on the surface of the porous sheet. In addition, if the sheet is three-dimensionally irradiated with energy beams, it is possible to make the multilayer structure of wiring and via portions in a single porous sheet.

When such a pattern plating method utilizing electroless plating is used, the plating solution contacts the electrode of the underlying electronic device via the porous sheet. As a result, if the electrode is formed of copper, gold, silver or platinum, plating is also deposited from the electrode. For example, in the case of a usual copper plating solution using formalin as a reducing agent, copper acts as an autocatalyst to deposit copper plating. If plating is deposited from the surface of the electrode, it is integrated with plating metal deposited in the via portion, so that electric connection to the via portion is ensured. If the plating deposited from the surface of the electrode is thus integrated with the plating deposited in the porous sheet, it is possible to obtain a very good electric continuity which is better than that in a state that the electrode is simply pressed on the conducting portion of the porous sheet. In addition, if the surface of the electrode and the conducting portion of the porous sheet are made of the same metal, e.g. copper, it is possible to connect them without inserting different kinds of metals into the connecting interface. In this case, even if plating is deposited from the surface of the electrode, there is not the possibility that reworkability is damaged. That is, since the porous sheet closely contacts or is very close to the surface of the electrode, the deposition of plating from the surface of the electrode is neccessarily carried out in the porous sheet. Therefore, since the deposited plating is integrated with the porous structure of the porous sheet, if the porous sheet is peeled off during a rework, the deposited plating can be simultaneously removed.

Therefore, with respect to the via and wiring portions formed at the conductive portion forming step, electric characteristic examinations, such as continuity and insulation test, and examinations, such as external test, are preferably carried out. If failure exists, the electronic device can be easily reproduced to be reworked by peeling the porous sheet off.

Bonding Integration Step

The porous sheet on which the package wiring portions, such as via and wiring portions, are formed at the conductive portion forming step is integrated with the electronic device by adhesion to be a semiconductor package or a module. If the porous sheet is formed of a thermoplastic resin, it can be integrated with and bonded to the electronic device by heating and pressing. In addition, after the porous sheet is impregnated with a curing resin, such as a thermosetting resin, the resin is cured while being pressed, so that the porous sheet is integrated with and bonded to the electronic device.

The resins with which the porous sheet is impregnated include curing resins, such as thermosetting resins, photo-curing resins and electron-beam-curing resins, and thermoplastic resins. These curing resins and thermoplastic resins should not particularly be limited, but well-known resins can be widely used. The curing resins include epoxy resins, phenol resins, bismale imide resins, cyanate ester resins, bismale imide triazine resins, benzicyclobutene resins, polyimide resins, polybenzooxazole resins, butadiene resins, silicone resins, polycarboimide resins, and polyurethane resins. The thermoplastic resins include polyamide resins and fluorine containing resins.

The impregnated resins may contain fine fillers of ceramics, such as silica and alumina. Moreover, in place of the resins, silsesquioxanes and so forth may be impregnated to be cured to be changed to ceramics, such as silica. Such resins and ceramics may be foamed so as to have a low dielectric constant.

The photosensitive adhesions used for fixing the porous sheet to the electronic device by the pressure sensitive adhesion are preferably thermally decomposed to be removed during this bonding integration step. For example, when an acrylic polymer is used as the pressure sensitive adhesive, it is possible to gasify and remove the pressure sensitive adhesive by heating at about 200° C. to 350° C. Alternatively, curing pressure sensitive adhesives cured by heat, light or electron beams may be used. By curing the pressure sensitive adhesive, the bonding strength to the electronic device can be enhanced. The curing pressure sensitive adhesives include formulated acrylic pressure sensitive adhesives including cross-linked groups. Such curing adhesives are most excellent in order to prevent displacement. That is, because such a curing adhesive can be easily reworked since it is pressure-sensitively bonded during curing, and because such a curing adhesive can continuously cause the porous sheet to be fixed to the electronic device until the curing resin or the like is cured after the porous sheet is impregnated with the curing resin.

By carrying out the above described pressure sensitive adhesion step, energy beams irradiation step, conductive portion forming step and bonding integration step, the package wiring portion connected to the electrode of the electronic device is formed. By stacking a porous sheet thereon or the like, a build-up wiring layer may be formed.

As described above, according to this embodiment, it is possible to connect an electronic device having a narrow pad pitch, it is difficult to cause displacement, and it is possible to rework.

Furthermore, it is not always required to irradiate with energy beams after the electronic device is mounted on the porous sheet. The electronic device may be mounted after the latent image for a package wiring pattern is formed by selectively irradiating with energy beams. Particularly, when both sides of the porous sheet are irradiated with energy beams in order to form two wiring layers in the porous sheet, the porous sheet is preferably irradiated with energy beams before the electronic device is mounted, since the electronic device does not obstruct irradiation. In either method, the plating deposited from the surface of the electrode of the electronic device is integrated with the plating deposited from the latent image, so that a good electric connection can be obtained. However, the method for forming the latent image after mounting the electronic device is superior since it is difficult to cause the displacement between the electronic device and the latent image for the electrode pattern.

Second Embodiment

An electronic device connecting method according to a second embodiment of the present invention is characterized in that a porous sheet is applied on a carrier sheet by the pressure sensitive adhesion to be irradiated with energy beams to form latent images for via and wiring patterns. FIGS. 4A through 4E show steps in an electronic device connecting method according to the second embodiment of the present invention.

Figure 4A:
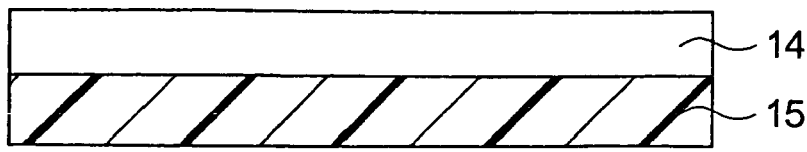
FIGS. 4A through 4E are sectional views showing steps in a method for connecting an electronic device according to a second embodiment of the present invention.

First, as shown in FIG. 4A, a porous sheet 15 is applied, by the pressure sensitive adhesion, on a base material serving as a carrier sheet having a good dimensional stability, i.e. on a carrier sheet 14, such as a metal sheet or a polymer sheet which is formed of, e.g. polyimides or polyesters, such as polyethylene terephthalate. As this porous sheet 15, there may be used a sheet wherein a photosensitive layer for producing or eliminating an ion exchange group by irradiation with energy beams is formed on the surface in holes. By applying the porous sheet 15 on the carrier sheet 14, the dimensional stability and mechanical strength of the porous sheet 15 are ensured.

Figure 4B:
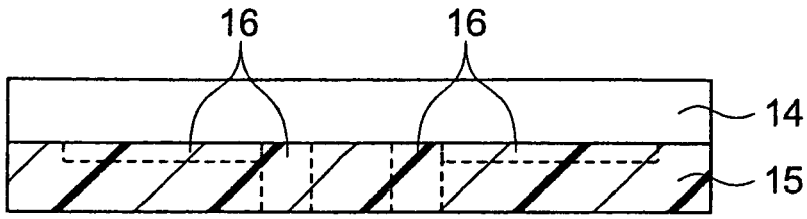
Figure 4C:
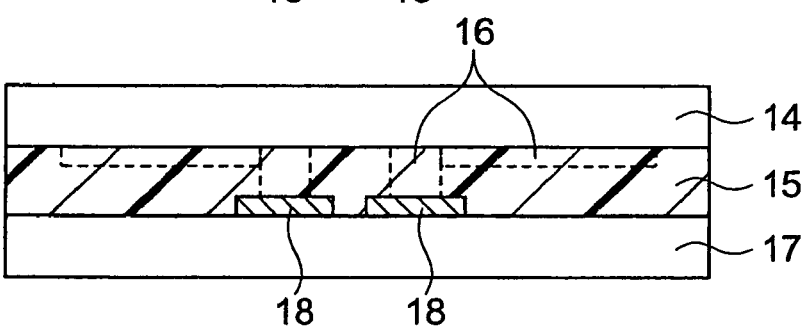

Then, as shown in FIG. 4B, a predetermined region of the porous sheet 15 supported on the carrier sheet 14 is irradiated with energy beams to form latent images 16 for a package wiring pattern. Subsequently, after the latent images 16 of the porous sheet 15 are aligned with electrodes 18 of an electronic device 17 (see FIG. 4B), the porous sheet 15 is mounted on the electronic device 17 to be applied thereon and fixed thereto by the pressure sensitive adhesion (see FIG. 4C).

Figure 4D:
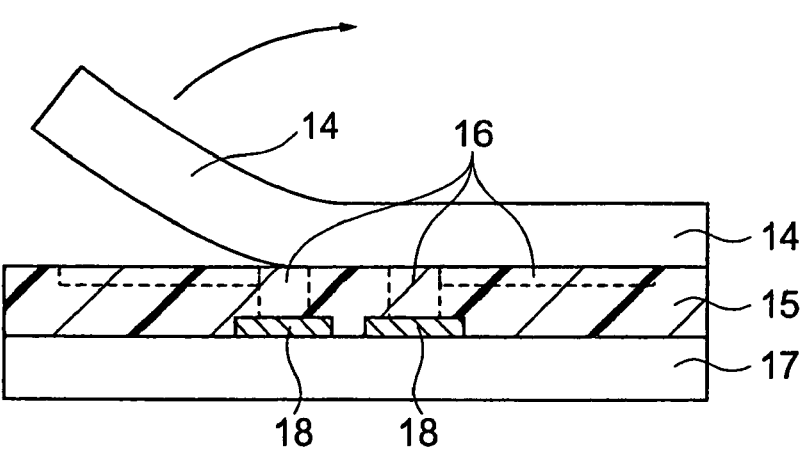

Then, after the porous sheet 15 is mounted on the electronic device 17, the carrier sheet 14 is peeled off, and the porous sheet 15 is transferred to the electronic device 17 (see FIG. 4D).

Figure 4E:
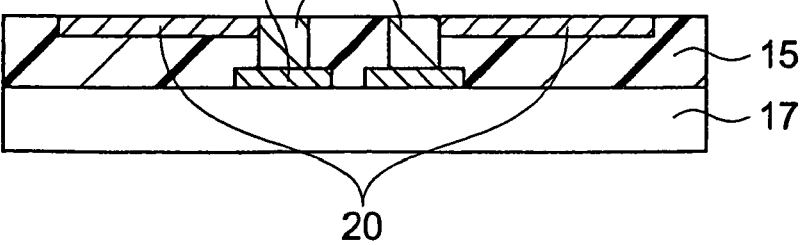

Then, as shown in FIG. 4E, plating or the like is carried out to form a package wiring portion of via contacts 18 and wiring portions 20. Moreover, after continuity to the electrodes 18 is examined, the porous sheet 15 is bonded to and integrated with the electronic device 17. In order to carry out the bonding integration, there may be adopted the method for impregnating the porous sheet 15 with a resin.

When the porous sheet 15 is supported on the carrier sheet 14 according to this second embodiment, it is required to pressure-sensitively bond the porous sheet 15 to both of the carrier sheet 14 and electronic device 17, so that both sides of the porous sheet 15 are pressure sensitive adhesive. When a porous sheet 15 being pressure sensitive adhesive on only one side is used, the carrier sheet 14 is pressure sensitive adhesive.

When, the sheet-like base material on the carrier sheet 14 is transferred to and applied on the flat electronic device 17, such as a semiconductor chip, bubbles easily remain between the sheet-like base material and the electronic device 17. However, when the porous sheet 15 is a three-dimensional network sheet, air and so forth can pass through the porous sheet 15 in the thickness directions of the sheet as well as in the plane directions of the sheet. Therefore, even if the carrier sheet 14 has no vent, there is not the possibility that bubbles remain, so that it can closely adhere to the electronic device 17. At this time, since the porous sheet 15 can have flexibility in the thickness directions of the sheet, it is possible to absorb irregularities of the surface of the electronic device 17 to improve adhesion.

As the base material serving as the carrier sheet 14, a smooth base material may be used. As compared with a case where the porous sheet is applied on the electronic device 17, the porous sheet on the smooth carrier sheet can be irradiated with energy beams without fuzziness or defocusing, so that the precision of irradiation pattern can be enhanced. The carrier sheet 14 may have fine punched holes so that the plating solution or the like passes through the carrier sheet 14. However, the carrier sheet 14 is preferably a smooth non-hole sheet in view of dimensional stability. If the carrier sheet 14 is made of a transparent base material capable of transmitting exposed light, the porous sheet 15 can be exposed via the carrier sheet 14 from the side of the carrier sheet 14. If both sides of the porous sheet 15 on the side of the carrier sheet and on the opposite side to the carrier sheet, two wiring layers and via contacts for interconnection to these wiring layers can be easily made in a single porous sheet 15 without displacement. In addition, the carrier sheet 14 can be fed in the form of a roll, so that it is possible to carry out a reel-to-reel process.

As described above, according to this embodiment, it is possible to connect to an electronic device having a narrow pad pitch, it is difficult to cause displacement, and it is possible to carry out rework.

Third Embodiment

Referring to FIG. 5, an electronic device connecting method according to a third embodiment of the present invention will be described below. The electronic device connecting method according to the third embodiment of the present invention is a method for carrying out plating after a porous sheet having a latent image for a wiring layer is applied on an electronic device. In this third embodiment, it is possible to expose both sides without being blocked by an electronic device. Therefore, two wiring layers and via contacts for interconnection to the wiring layers can be formed in a single porous sheet. The steps thereof are shown in FIGS. 5A through 5E.

Figure 5A:
FIGS. 5A through 5E are sectional views showing steps in a method for connecting an electronic device according to a third embodiment of the present invention.
Figure 5B:
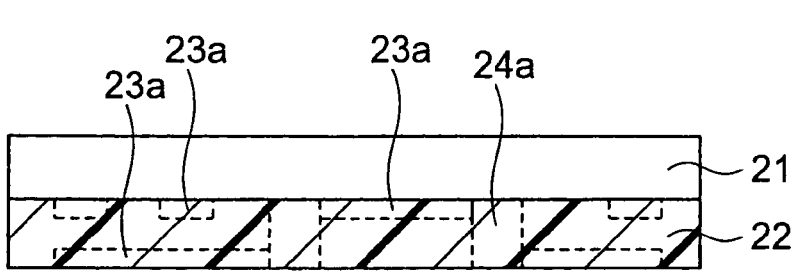
Figure 5C:
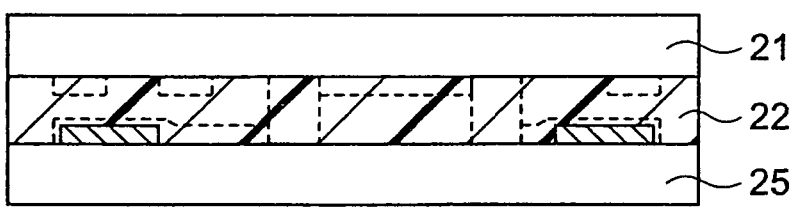

First, as shown in FIG. 5A, a porous sheet 22 applied on a carrier sheet 21 by the pressure sensitive adhesion is prepared. Subsequently, latent images 23a for two wiring layers and latent images 24a for via connections are formed in the porous sheet 22 by double side exposure or the like. The porous sheet 22 in which the latent images 23a and 24a for the two wiring layers and via contacts are formed and which is lined with the carrier sheet 21 is aligned with an electronic device having electrodes 25a (see FIG. 5B), to be applied thereon by the pressure sensitive adhesion (see FIG. 5C).

Figure 5D:
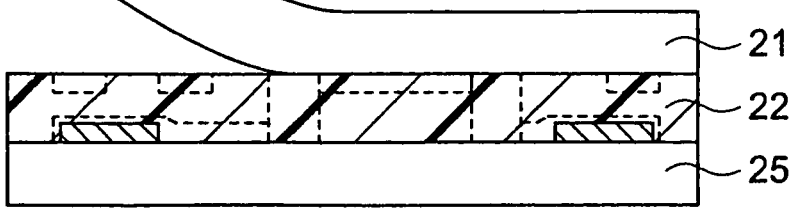
Figure 5E:
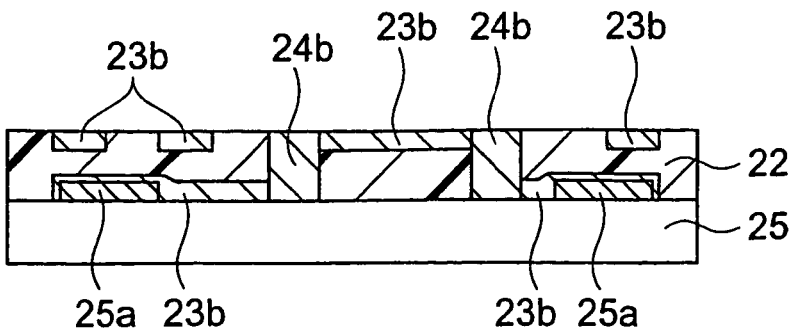

Then, after application, the carrier sheet 21 is peeled off (see FIG. 5D), and the porous sheet 22 is transferred to the electronic device 25 (see FIG. 5D). After transfer, the latent image portions 23a and 24a are selectively plated by electroless plating to form connecting portions of the two wiring layers 23b and via contacts 24 to the electrodes 25a of the electronic device 25. After the continuity of the wiring layers 23b and via contacts 24b to the electrodes 25a of the electronic device 25 is examined, the porous sheet 22 is bonded to and integrated with the electronic device 25. In order to carry out the bonding integration, a method for impregnating the porous sheet 22 with a resin or the like may be adopted as described above.

One side or both sides of the porous sheet 22 are preferably pressure sensitive adhesive. The pressure sensitive adhesive surface of the porous sheet 22 is preferably covered with a dust preventing protective cover which is removed immediately the porous sheet 22 is applied. In place of the pressure sensitive adhesive porous sheet 22, the carrier sheet 21 and the electronic device 25 may be pressure sensitive adhesive. However, if the carrier sheet 21 is pressure sensitive adhesive, dust is easy to adhere thereto when it is reused. In addition, if the electronic device 25 is pressure sensitive adhesive, it is required to cover the electronic device 25 with a dust preventing sheet. If a protective sheet capable of transmitting exposed light is used, exposure can be carried out while the electronic device 25 is covered with the protective sheet. When the carrier sheet 21 is not reused, the pressure sensitive adhesive carrier sheet 21 may be applied on the opposite side to the pressure sensitive adhesive side of the porous sheet 22, only one side of which is pressure sensitive adhesive, and a non-pressure sensitive adhesive protective sheet may be applied on the pressure sensitive adhesive side. With such a construction, when the porous sheet 22 is applied on the electronic device 25, the pressure sensitive adhesive side is not exposed to the outside, so that dust and so forth are difficult to adhere thereto.

As described above, according to this embodiment, it is possible to connect to an electronic device having a narrow pad pitch, it is difficult to cause displacement, and it is possible to carry out rework.

Fourth Embodiment

In an embodiment of the present invention, an electronic device and a porous sheet can be fed in a line. By synchronously feeding both one-to-one and by fixing both by the pressure sensitive adhesion, it is possible to produce a semiconductor package or a module in a sequential process. The electronic device and porous sheet are preferably fixed to a tape shaped carrier sheet by the pressure sensitive adhesion to be fed. If they are fixed to the carrier sheet, handling is easy, and particularly, the porous sheet is reinforced by the carried sheet, so that it is possible to prevent the porous sheet from being extended during conveyance on the line.

Also when the electronic device and the porous sheet are synchronously fed, the porous sheet may be irradiated with energy beams to form a latent image after the porous sheet is applied on the electronic device, or the porous sheet may be irradiated with energy beams to form a latent image before the porous sheet is applied on the electronic device. The case where the latent image is formed after the porous sheet is applied on the electronic device is superior since it is difficult to cause displacement.

Figure 6:
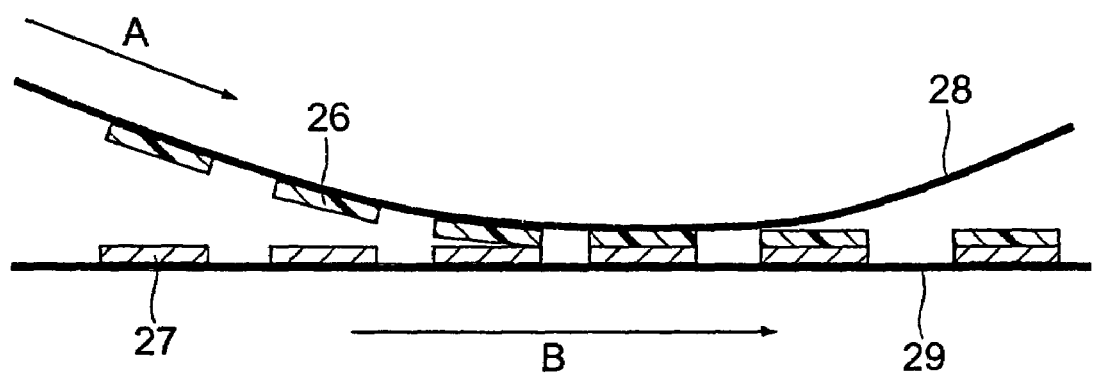
FIG. 6 is a sectional view for explaining a method for connecting an electronic device according to a fourth embodiment of the present invention.

FIG. 6 shows an electronic device connecting method according to a fourth embodiment of the present invention. In the connecting method in the fourth embodiment, an electronic device and a porous sheet are fed on a line to be connected to each other. As shown in FIG. 6, a porous sheet 26 arranged on a first carrier sheet 28, and an electronic device 27 having exposed electrodes (not shown) arranged on a second carrier sheet 29 are fed. The first carrier sheet 28 and the second carrier sheet 29 synchronously move in directions of arrows A and B, respectively. Furthermore, FIG. 6 schematically shows that they can be produced on a line, and the details of the positional relationship between the porous sheet 26 and electronic device 27, and the mechanism of fixing due to the pressure sensitive adhesion can be optionally determined.

In order to sequentially produce, i.e. in order to synchronously the electronic device 27 and the porous sheet 26 one to one on a line to fix them by the pressure sensitive adhesion, it is required to fed the electronic device 27 and porous sheet 26 while being aligned. As a preferred method for feeing the aligned electronic device and porous sheet, the electronic device 27 and the porous sheet 26 are previously mounted on the carrier sheets 28 and 29, respectively, and the carrier sheets 28 and 29 are fed.

In the fourth embodiment shown in FIG. 6, the electronic devices 27 and the porous sheets 26 may be independent from each other, or an optional number of electronic devices and porous sheets are connected to the carrier sheets 28 and 29, respectively. Alternatively, as semiconductor chips connected to a continuous sheet-like flexible printed board, a wiring board may serve as a carrier sheet. If all of the electronic devices and porous sheets are connected, semiconductor packages and/or modules can be handled while being wound onto the roll, and if the electronic devices and porous sheets are independent, they can be mounted on a tray or the like to be fed.

In order to fix the electronic devices 27 and the porous sheets 26 by the pressure sensitive adhesion, the electronic devices 27 can directly contact the porous sheets 26 while being mounted on the carrier sheets 28 and 29 as shown in FIG. 6. Alternatively, a robot may transfer the electronic devices 27 or the porous sheets 26 from one carrier sheet to the other carrier sheet. When they are fed while being mounted on the tray or the like, the robot or the like may transfer the electronic devices 27 and/or the porous sheets 26 to cause them to contact each other.

Furthermore, FIG. 6 does not show means for causing the porous sheets 26 to be selectively irradiated with energy lines, and means for forming the pattern wiring portion. However, these means may be provided at predetermined positions on a line as shown in, e.g. FIGS. 8 and 9 which are described in detail later. Moreover, it is considered to provide means for examining electric characteristics of a package wiring of a porous sheet to which an electronic device pressure-sensitively adheres, means for removing defectives from the line, and means for bonding and integrating non-defectives to complete a semiconductor package and/or a module. In this case, the steps of producing the semiconductor package and/or module including the step of forming the package wiring can be in-line, so that it is possible to more efficiently produce a small, light semiconductor package and/or module having a narrow pitch.

As described above, according to this embodiment, it is possible to contact to an electronic device having a narrow pad pitch, it is difficult to cause displacement, and it is possible to carry out rework.

Fifth Embodiment

Figure 7:
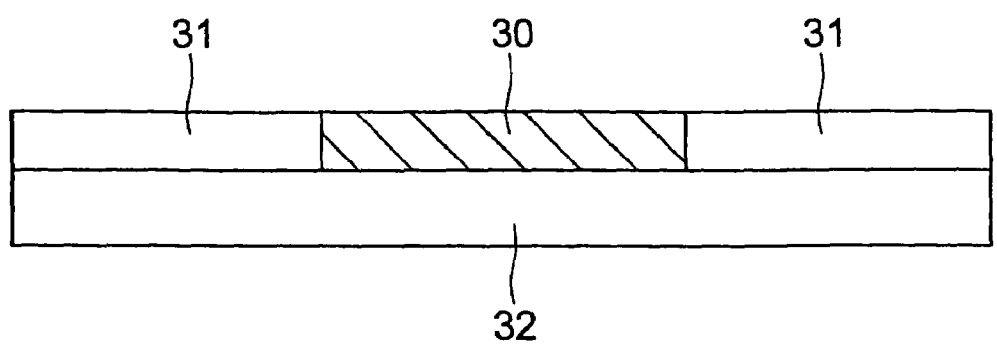
FIG. 7 is a sectional view showing a carrier sheet on which an electronic device having no irregularities on the surface thereof is mounted.

When an electronic device is mounted on a carrier sheet or a tray, there are irregularities by the thickness of the electronic device. If such irregularities exist, it is difficult to apply a porous sheet thereon. Therefore, when a thin plate-like electronic device, such as a semiconductor chip, is used, if spacers 31 having the same thickness of that of the electronic device 30 is stacked on a carrier sheet or tray 32 in a portion in which the electronic device is not mounted as shown in FIG. 7, it is possible to eliminate irregularities.

Figure 8:
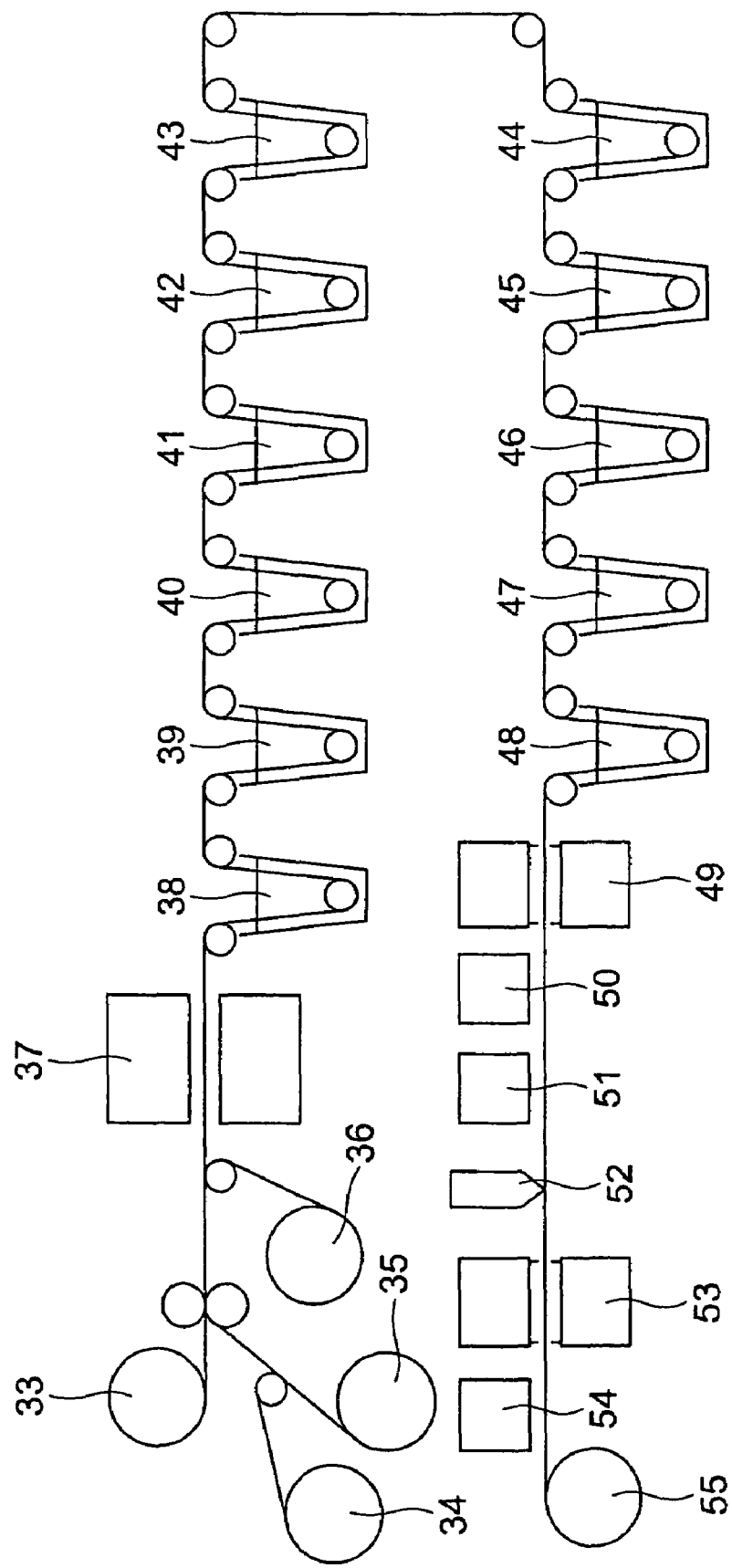
FIG. 8 is a sectional view showing steps in a method for connecting an electronic device according to a fifth embodiment of the present invention.

Referring to FIG. 8, a fifth embodiment of the present invention for connecting an electronic device by using such a carrier sheet which eliminates irregularities will be described below. The electronic device connecting method in this fifth embodiment is carried out by using a reel-to-reel producing line, and its steps are shown in FIG. 8.

First, a first carrier on which semiconductor devices, such as semiconductor chips, are mounted is fed out of a reel 33. In addition, porous sheets which are sandwiched between a protective sheet and a second carrier sheet and which have a photosensitive layer having, e.g. naphthoquinone diazide residue, are fed out of a reel 35. Then, the protective sheet is peeled off by means of a peeling device 24, and the porous sheet is applied on the electronic device mounted on the first carrier sheet fed from the reel 33. Thereafter, the second carrier sheet is peeled off by means of a peeling device 36, and the porous sheet is fed to an exposure device 37.

The naphthoquinone diazide residue is exposed by the exposure device 37 to change to indene carboxylic acid residue. Thereafter, the indene carboxylic acid is dipped in an alkali processing bath 38 to be anionized. After it is washed in a washing bath 39, it is caused to absorb, e.g. copper ions, in an ion exchanging bath 40. Subsequently, after it is washed in a washing bath 41, it is degreased in a degreasing bath 42 filled with acetone. Then, after it is washed in a washing bath 43, metal ions, such as copper ions, absorbed in a reducing bath 44 are reduced to be metal fine particles which are used as plating nucleuses. After it is washed in a washing batch 45, electroless plating is carried out in an electroless plating bath 46. Such steps may be suitably changed in accordance with the kind of a plating solution to be used, or the like.

After plating, it is washed in a washing bath 47. Thereafter, it is rinsed in a rinsing bath 48, which is filled with isopropanol, to remove moisture. After it is dried by a drier 49, it is examined by an examining device 50. As a result of the examination, electronic devices are collected from defectives by a collecting device 51. After the examination, a curing resin is applied thereon by means of an applying device 52, and then, the resin is cured by a resin curing device 53. At this time, a solder resist layer is simultaneously formed by the curing resin. After the curing, it is examined by an examining device 54, and it is wound onto a winding reel 55. Thereafter, on a line (not shown), the steps of forming an opening in the solder resist layer by means of a laser punch or the like, carrying out a surface treatment, such as Ni—Au plating, on the opening portion, and forming a solder bump are carried out to complete a semiconductor package.

In this embodiment, after a porous sheet is applied on an electronic device, such as a semiconductor chip, which is mounted on a carrier sheet to be sequentially fed, exposure is carried out. Thereafter, electroless plating is carried out, and then, a package wiring having connecting portions of a single wiring layer, a via contact and the electronic device is formed in the porous sheet. Thereafter, it is impregnated with a curing resin to bond the porous sheet to the electronic device. Thus, after the porous sheet is caused to pressure-sensitively adhere to the electronic device, the latent image is formed, and electroless plating is carried out. Therefore, there are advantages in that it is difficult to cause displacement and that it is easy to ensure electric connection between the electronic device and the package wiring portion.

As described above, according to this embodiment, it is possible to connect to an electronic device having a narrow pad pitch, it is difficult to cause displacement, and it is possible to carry out rework.

Sixth Embodiment

Figure 9:
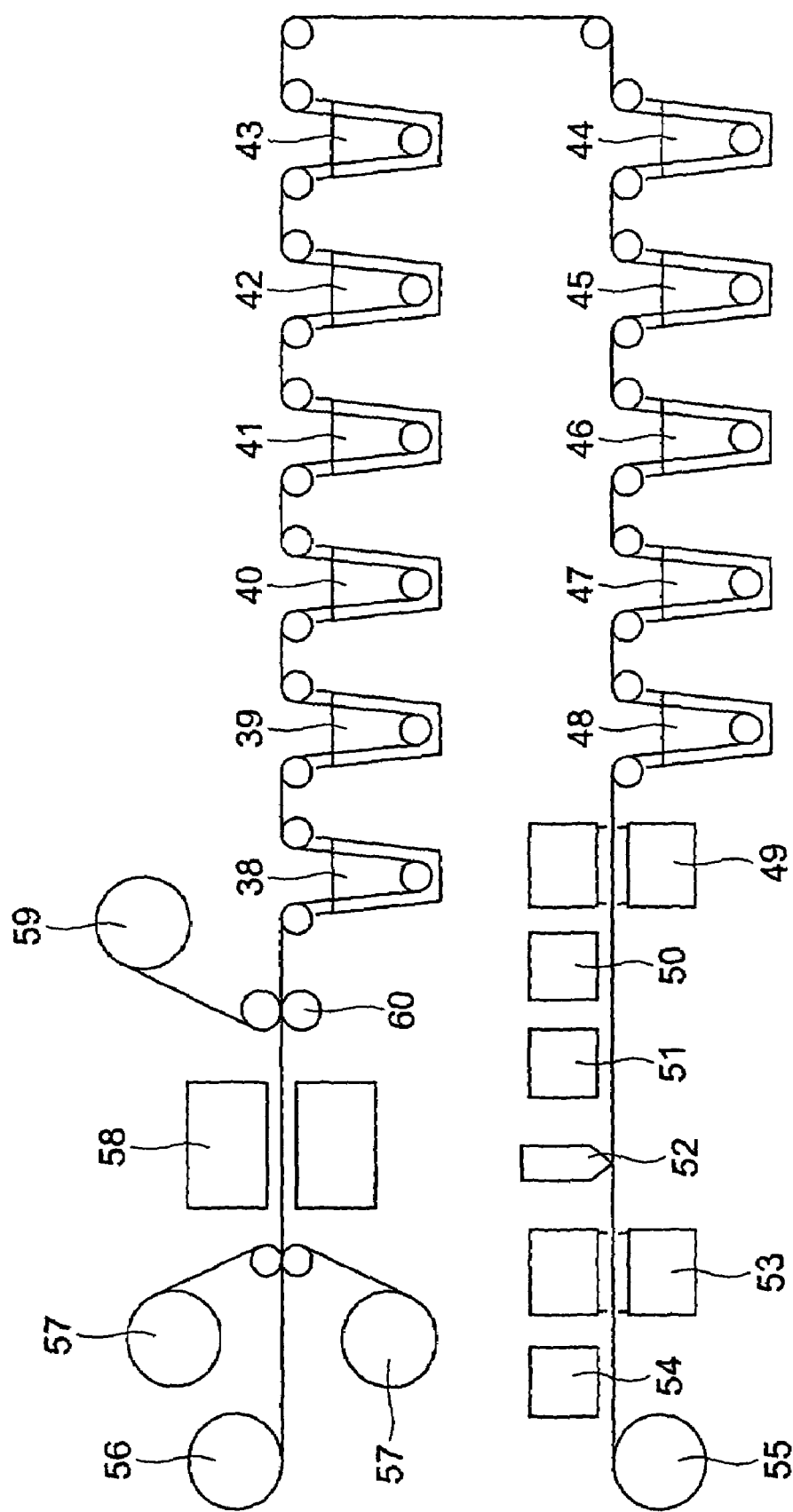
FIG. 9 is a sectional view showing steps in a method for connecting an electronic device according to a sixth embodiment of the present invention.

On the other hand, the latent image for a package wiring pattern may be formed by irradiating with energy beams before pressure-sensitively adhering and fixing to an electronic device. Referring to FIG. 9, this will be described as a sixth embodiment of the present invention. FIG. 9 is a schematic diagram showing a reel-to-reel producing line for carrying out a sixth embodiment of an electronic device connecting method according to the present invention.

First, a porous sheet which has a photosensitive layer having, e.g. naphthoquinone diazide residue, and both sides of which are covered with protective sheets, is fed out of a reel 56, and the protective sheets covering both sides of the sheet are peeled off by means of a peeling device 57. Thereafter, the sheet is fed to an exposure device 58 in which both sides are irradiated with energy beams to form latent images. At this time, the naphthoquinone diazide residue is exposed by the exposure device 58 to change to indene carboxylic acid residue. Thereafter, the above described porous sheet is applied, by means of an applying device 60, on an electronic device, such as a semiconductor chip, which is fed out of a reel 59 and which is mounted on a carrier sheet. Thereafter, it is dipped in an alkali processing bath 38. Subsequent steps are the same as those in the fifth embodiment.

In this embodiment, after the porous sheet is exposed to form the latent image for the package wiring pattern, the electronic device, such as the semiconductor device, mounted on the carrier sheet to be sequentially fed is fixed thereon by the pressure sensitive adhesion. Thereafter, electroless plating is carried out to form the connecting portion of the package wiring to the electronic device, and then, it is impregnated with the curing resin which is cured to bond the porous sheet to the electronic device. Since the porous sheet on the smooth carrier sheet is irradiated with energy beams, it is possible to precisely form the latent image. Exposure may be carried out on one or both sides. Particularly in this embodiment, exposure can be carried out on both sides without being blocked by the electronic device, so that it is possible to form a packaging wiring comprising via contacts for connecting two wiring layers.

As described above, according to this embodiment, it is possible to contact to an electronic device having a narrow pad pitch, it is difficult to cause displacement, and it is possible to carry out rework.

Furthermore, also in the connecting methods in the fifth and sixth embodiments, of course, an examining device can be arranged in the middle of a line before the porous sheet is bonded to the electronic device, and porous sheets of defectives can be peeled off to be reworked.

Also in either method, the porous sheet preferably has a photosensitive layer, which produces or eliminates an ion exchange group by irradiation with energy lines, on the surface in the holes, and the porous sheet is preferably exposed by pattern exposure to cause the ion exchange group to be produced or eliminated in the exposure portion of the photosensitive layer of the porous sheet to form a pattern. Moreover, the method for forming the package wiring by causing the pattern of the ion exchange group, which is formed in the exposed or unexposed portion of the photosensitive layer, to absorb the conductive material or its precursor and by preferably carrying out electroless plating, is excellent since it is possible to form a fine pattern capable of providing a good electric connection to the electrode of the electronic device.

That is, with respect to the porous sheet, it is possible to form the latent image by irradiation with energy beams and to fill the conductive material, by the above described method.

Both of FIGS. 8 and 9 suppose the use of a porous sheet having a photosensitive layer which produces or eliminates an ion exchange group by irradiation with energy beams. In particular, there is shown an example of a case where a porous sheet having a photosensitive layer having naphthoquinone diazide residue is used. Of course, even if another kind of porous sheet is used, the basic flow of the line can be the same.

The electronic device connecting method according to the present invention should not be limited to the above described first through sixth embodiments, but the invention can be modified in various ways.

Seventh Embodiment

Figure 10:
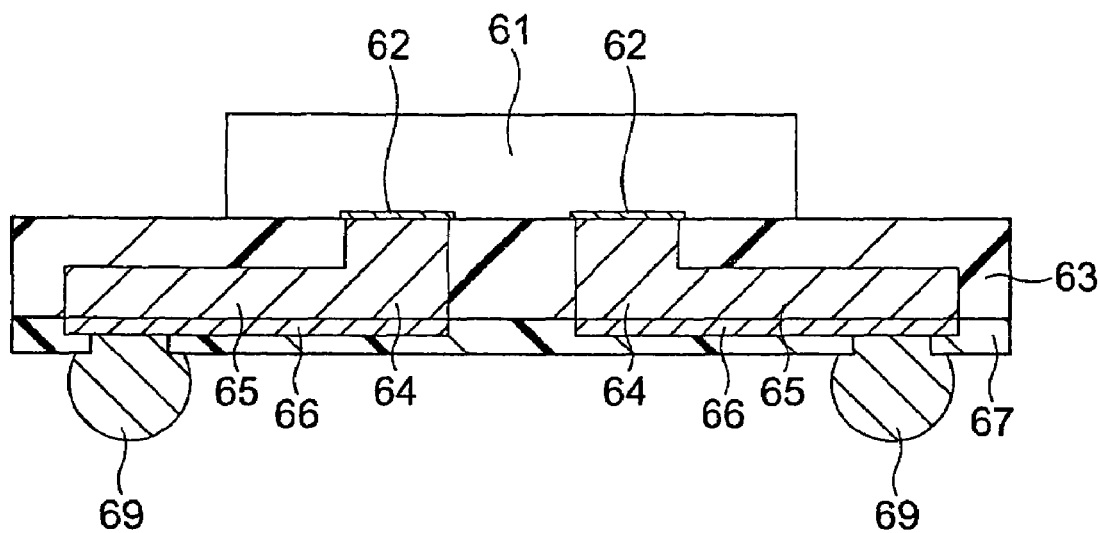
FIG. 10 is a sectional view showing a semiconductor package which is formed by a method for connecting an electronic device according to an embodiment of the present invention.

Referring to FIGS. 10 through 12D, a seventh embodiment of the present invention will be described below. FIG. 10 is a sectional view showing the construction of a semiconductor package which is formed by an electronic device connecting method in any one of the above described first through sixth embodiments. A porous sheet 63 closely contacts a semiconductor chip 61, and via contacts and wiring portions 65 are formed in the porous sheet 63 so as to be connected to electrodes 62. Parts 66 of the wiring portions 65 protrude from the porous sheet 63 to reduce wiring resistance. The semiconductor chip 61 are bonded to the porous sheet 63 by a curing resin or the like with which the porous sheet 63 is impregnated. A part of the impregnated resin forms a solder resist layer 67 on the porous sheet 63. Furthermore, the wiring portions 66 are connected to bumps 69 provided on the solder resist layer 67.

In a semiconductor package with such a construction, the via contacts 64 and wiring portions 65 are integrated with the porous sheet 63, so that it is difficult to cause breakage due to stress caused by the difference in thermal expansion coefficient between the semiconductor chip 61 and porous sheet 63. In particular, it is possible to suitably connect the interface between the via contacts 64 and wiring portions 65, not only the interface between the via contacts 64 and electrodes 62. In addition, since the solder resist layer 67 is integrated with the resin with which the porous sheet 63 is impregnated, it is difficult to peel off the interface between the solder resist layer 67 and porous sheet 63, so that reliability is high. Although FIG. 10 shows a package wherein the porous sheet 63 substrate is greater than the semiconductor chip 61, a package wherein the semiconductor chip 61 and the porous sheet 63 substrate may have the same chip size may be provided as shown in FIG. 11.

Figure 11:
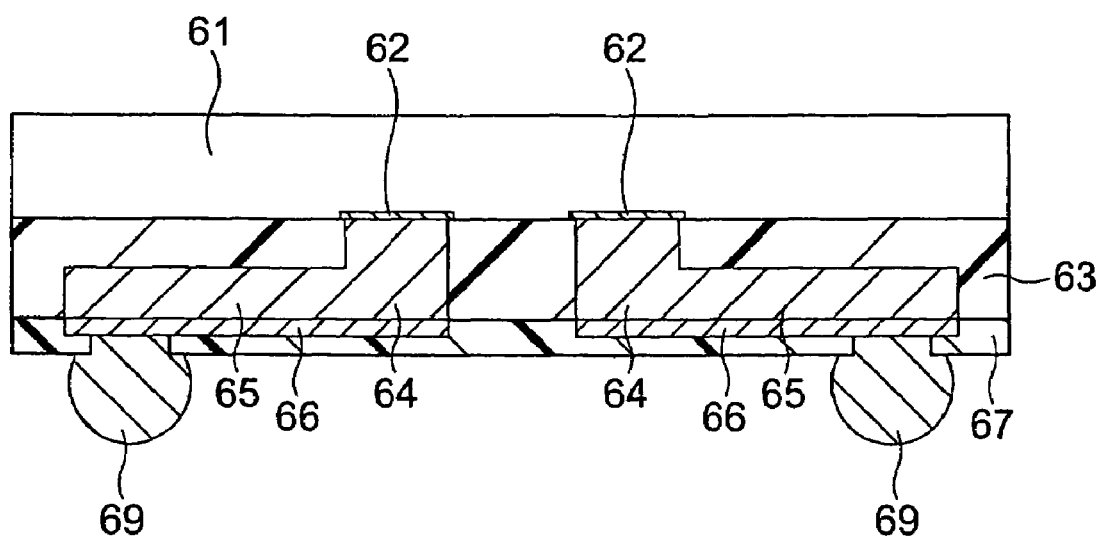
FIG. 11 is a sectional view showing another example of a semiconductor package.
Figure 12A:
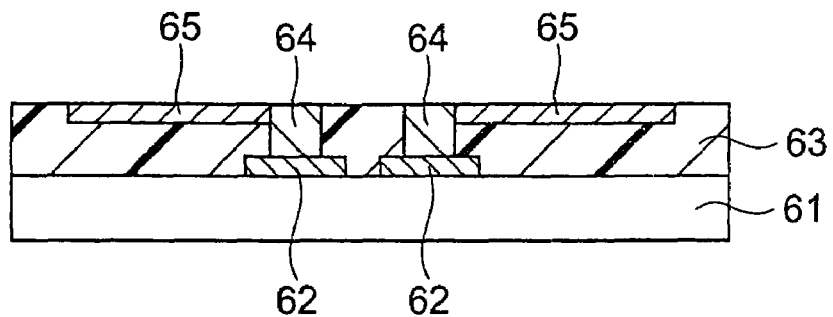
FIGS. 12A through 12D are sectional views showing steps in a method for producing a semiconductor package according to a seventh embodiment of the present invention.
Figure 12B:
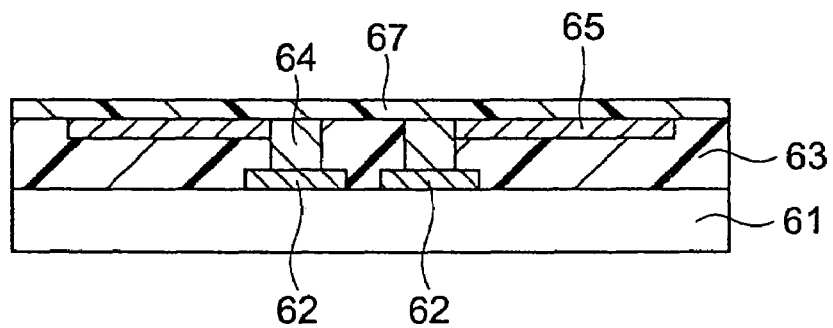
Figure 12C:
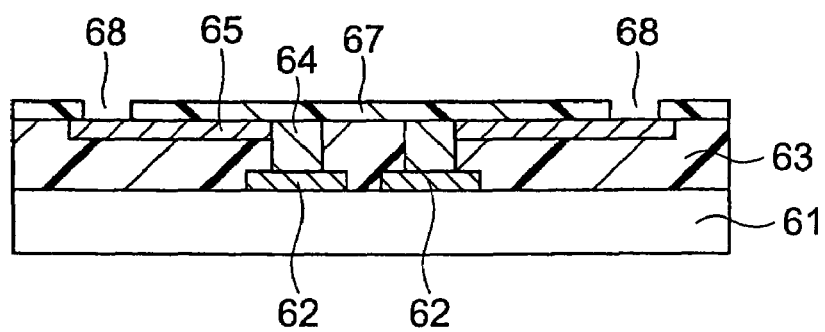
Figure 12D:
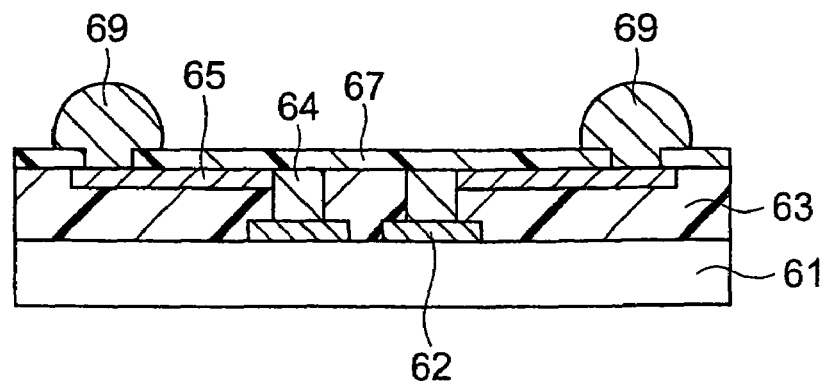

Steps of producing a semiconductor package shown in FIG. 10 or 11 are shown in FIGS. 12A through 12D. First, by using an electronic device connecting device in any one of the first through sixth embodiments, a porous sheet 63 which closely contacts a semiconductor chip 61 and in which via contacts 64 and wiring portion 65 connected to electrodes 62 is formed (see FIG. 12A).

Then, the porous sheet 63 is impregnated with a curing resin. The resin is cured to bond the semiconductor chip 61 to the porous sheet 63. When impregnation is carried out, the resin is protruded from the porous sheet 63 to form a solder resist layer 67 (see FIG. 12B). A predetermined region of the solder resist layer 67 is removed by means of a laser or the like to form an opening portion 68 for forming a solder bump (see FIG. 12C). After the opening portion 68 is plated with Ni—Au plating or the like, a solder bump 69 is formed to form a semiconductor package (see FIG. 12D).

When a semiconductor chip is used as an electronic device, the above steps may be carried out with respect to separated semiconductor chips, or the above describe steps may be carried out with respect to a semiconductor wafer. That is, after the porous sheet is applied on a wafer on which a circuit is formed, the above described steps are carried out. Thereafter, the wafer may be cut to form chip-size packages.

Eighth Embodiment

Figure 13A:
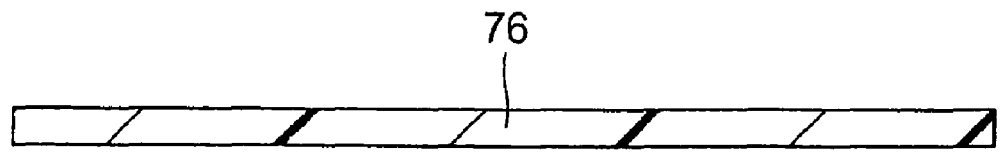
FIGS. 13A through 13C are sectional views showing steps in a method for producing a module according to an eighth embodiment of the present invention.
Figure 13B:
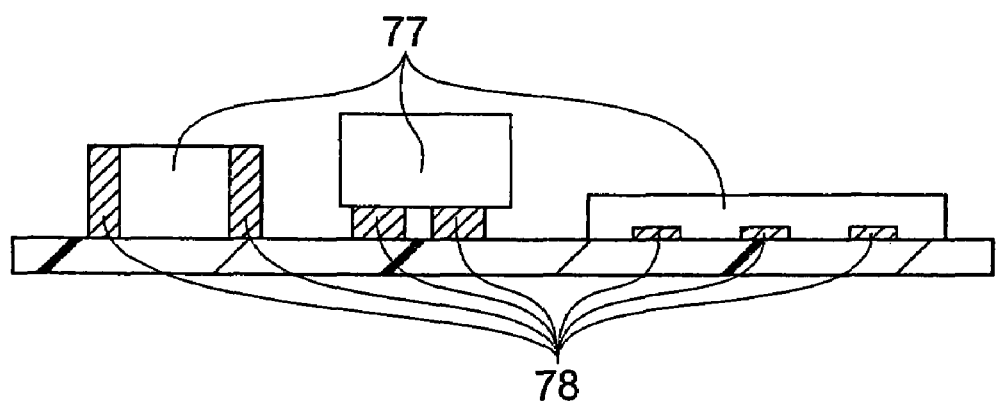
Figure 13C:
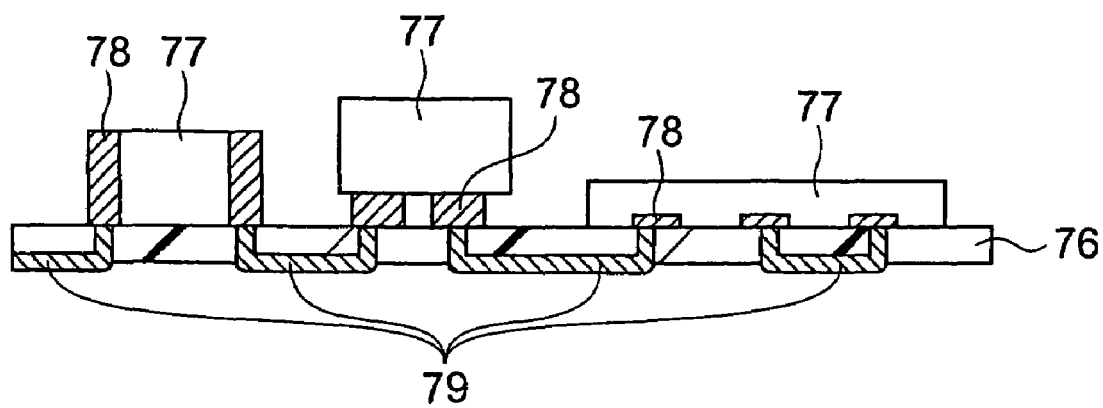

Referring to FIGS. 13A through 13C, an eight embodiment of the present invention will be described below. In this eighth embodiment, there is provided a method for producing a module, in which a plurality of electronic device are connected, by using an electronic device connecting method in any one of the first through sixth embodiment, and its producing steps are shown in FIGS. 13A through 13C.

First, after a plurality of electronic devices 77 are mounted on a porous sheet 76 shown in FIG. 13A (see FIG. 13B), wiring portions 79 for interconnecting the electrodes 78 of the electronic devices 77 may be formed in the porous sheet 76 (see FIG. 13C).

Furthermore, after the electronic devices are previously arranged on a carrier sheet, the porous sheet may be applied thereon. However, in this method, it is difficult to form a module having electronic devices having different height. In this case, the electronic devices 77 may be arranged on the porous sheet 76 as shown in FIGS. 13A through 13C, or a method shown in FIGS. 14A through 14F may be used.

Figure 14A:
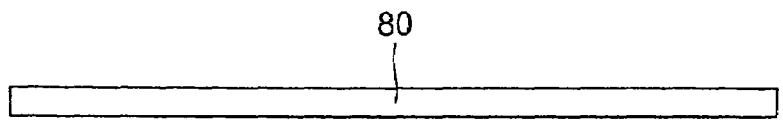
FIGS. 14A through 14F are sectional views showing steps in a modified example of the eighth embodiment.
Figure 14B:
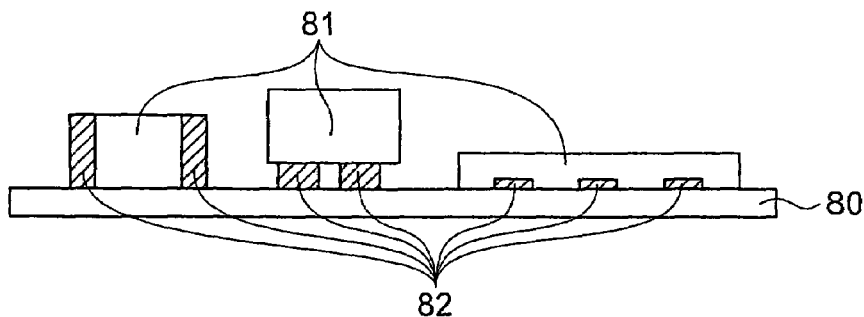
Figure 14C:
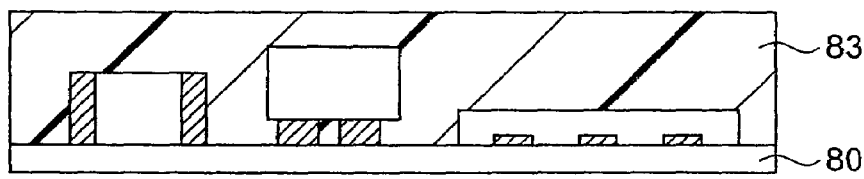
Figure 14D:
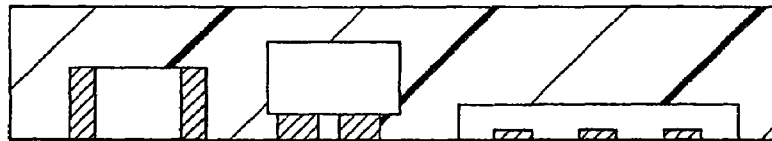
Figure 14E:
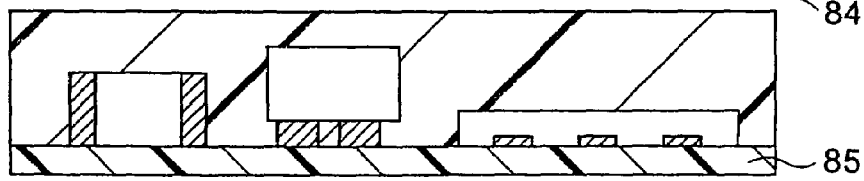
Figure 14F:
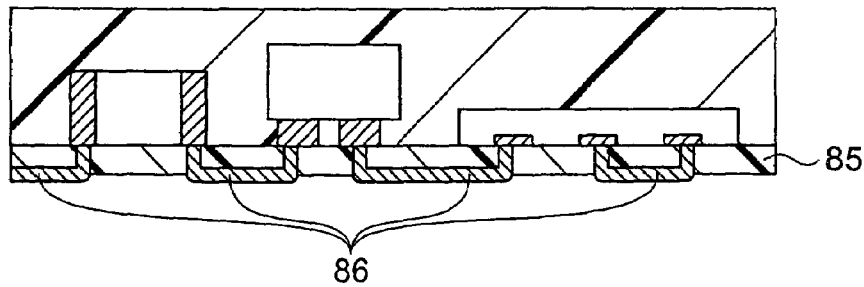

The method shown in FIGS. 14A through 14F will be described below. After electronic devices 81 are arranged on a carrier sheet, which is shown in FIG. 14A, so that electrodes 82 contact the carrier sheet 80 (see FIG. 14B), the whole is fixed and integrated with a sealing resin 83 or the like (see FIG. 14C). Thereafter, if the carrier sheet 80 is peeled off (see FIG. 14D), the peeled surface becomes a smooth surface 84 on which the electrodes are exposed. A porous sheet 85 may be applied on this surface 84 to form wiring portions 86 and so forth (see FIG. 14F).

As described above, according to the method in this eighth embodiment, the module can be very simply prepared. In addition, an element including substrate, such as a build-up substrate including an electronic device, can be prepared. That is, for example, after a porous sheet is applied on a wiring substrate including an electronic device, a conductive portion is formed, and a build-up wiring layer is formed on the electronic device.

FIGS. 15A through 15E show an example where a porous sheet having a conductive portion in any one of the above described embodiments is used as a wiring substrate including an electronic device. An electronic device 90 is fitted into a porous sheet 88 in which a device hole 87 is previously formed (see FIGS. 15A and 15B). At this time, if the porous sheet 88 is lined with a carrier sheet 89, the electronic device 90 is easily fitted (see FIGS. 15A and 15B).

Figure 15A:
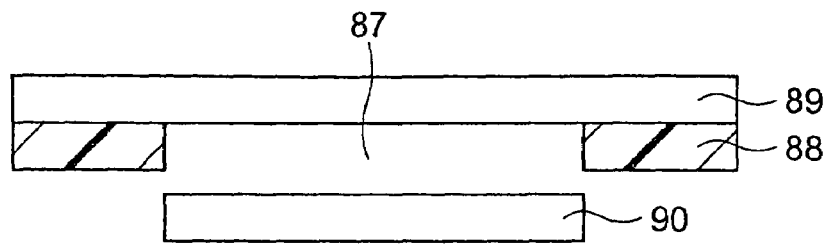
FIGS. 15A through 15E are sectional views showing steps of producing a wiring substrate including electronic devices by using a porous sheet.
Figure 15B:
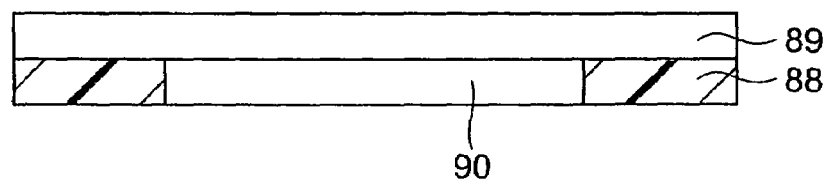
Figure 15C:
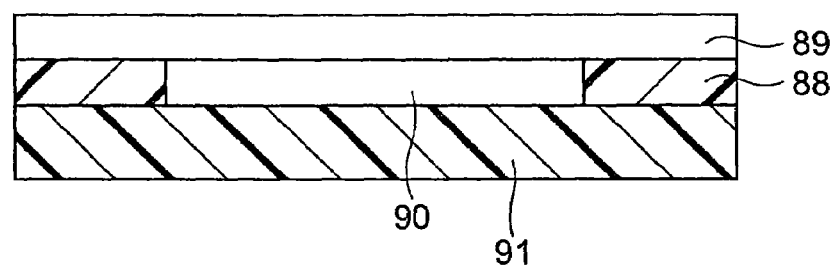
Figure 15D:
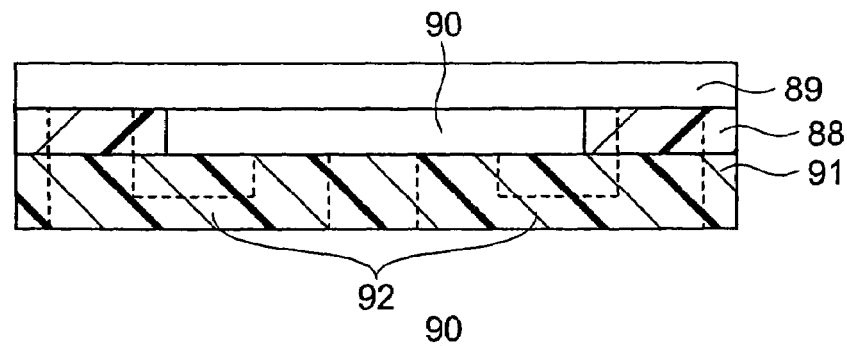
Figure 15E:
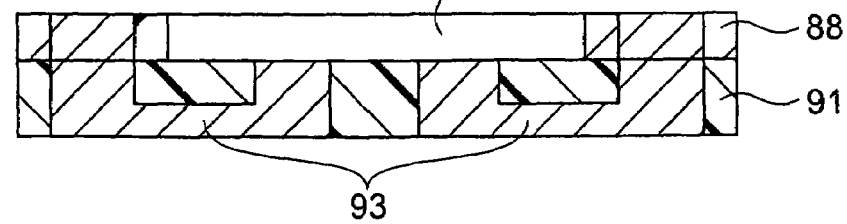

A porous sheet 91 is applied thereon (see FIG. 15C), and exposed to form a latent image 92 for wiring portions and via contacts in the porous sheet (see FIG. 15D). Moreover, the latent image 92 is plated to form wiring portions and via contacts 93 (see FIG. 15E). Thereafter, if it is impregnated with a curing resin or the like which is cured to be integrated, it is possible to form a device including substrate without damaging the electronic device.

As described above in detail, according to the seventh or eighth embodiment, it is possible to simply produce a small, light semiconductor package or module which is necessary for portable apparatuses and which has a narrow pitch. In addition, since it is easy to carry out rework if defectives are found, it is possible to enhance yields and to produce the semiconductor package or module at low costs.

EXAMPLES

Examples of the present invention will be described below in detail. However, the present invention should not be limited to these examples.

As an electronic device, a semiconductor chip having a thickness of 50 μm, a pad diameter of 100 μm and a pad pitch 200 μm was used. The surface of the pad was made of copper, and activated with a palladium substituted plating. The back and sides of the semiconductor chip was made to be hydrophobic by a silane coupling agent.

As a porous sheet for forming a package wiring, a PTFE porous sheet (mean hole diameter: 0.1 μm, thickness: 60 μm) processed so as to be hydrophilic was prepared, and an acrylic pressure sensitive adhesive solution was applied on one side thereof to be dried. As the acrylic pressure sensitive adhesive solution, a mixed solution prepared by adding an isocyanate cross-linking agent and a terpene pressure sensitive adhesion applying resin to a copolymer of 2-ethylhexyl acrylate, methyl methacrylate and acrylic acid was used. After applying and drying, the copolymer is cross-linked by the isocyanate cross-linking agent, and pressure sensitive adhesion is given to the PTFE porous sheet. In addition, a naphthoquinone diazide containing phenol resin (naphthoquinone diazide content: 33 equivalent mol %) being an organic photosensitive composition was solved in acetone to prepare a 1 wt % acetone solution. The whole surface of the porous sheet was coated with the obtained solution by the dipping method. After drying at a room temperature for 30 minutes, the surface in holes was coated with the naphthoquinone diazide containing phenol resin to obtain a photosensitive and pressure sensitive adhesive porous sheet.

After the semiconductor chip was mounted on this porous sheet so that the side on which the pads were formed contacts the porous sheet, a pressure of 10 g/cm$^2$ was applied to cause the semiconductor chip to adhere to the porous sheet by the pressure sensitive adhesion. After the adhesion, exposure was carried out by means of CANON PLA 501 on the conditions of light exposure of 200 mJ/cm$^2$ (wavelength 436 nm) via a mask having a wiring pattern of a line width of 20 μm and a space of 30 μm, to form a latent image for a wiring pattern of indene carboxylic acid on a photosensitive layer. Moreover, exposure was carried out on the conditions of light exposure of 2000 mJ/cm$^2$ (wavelength 436 nm) via a mask having a via pattern having a via diameter of 50 μm, to form a latent image for a via pattern.

After the latent image for wiring and via patterns was formed, it was dipped in an aqueous solution of 5 mM boron sodium hydroxide for 10 minutes while the semiconductor chip was applied thereon, and thereafter, it was washed with distilled water three times. Then, after it was dipped in an aqueous solution of 50 mM copper acetate for 30 minutes, it was washed with distilled water. Subsequently, after it was dipped in an aqueous solution of 30 mM boron sodium hydroxide for one hour, it was washed with distilled water. Moreover, it was dipped in an electroless copper plating solution PS-5038 (produced by Ebara Eugelight) for three hours, to form a copper plating to form a package wiring of wiring and via contacts.

As a result, a surface wiring having a line width of 25 μm, a space of 25 μm and a depth of 20 μm was formed on the surface of the PTFE porous sheet. In addition, a landless via contact having a diameter of 55 μm was formed so as to pass through the PTFE porous sheet in thickness directions. Moreover, the surface wiring was connected to the via contact by a smooth curve.

On the other hand, as an impregnated resin with which the porous sheet was impregnated, a resin solution prepared by adding 2 parts of aluminum chelate catalyst by weight to 100 parts of cyanate ester resin (produced by Asahi Chiba) by weight was used. The porous sheet on which the above described conductive portion was formed was impregnated with this resin solution, which was heated at 150° C. for five hours to be cured. The porous sheet was not only impregnated with the impregnated resin, but the resin was protruded from the porous sheet to form a solder resist layer having a thickness of 10 μm.

After curing, the resin coating the pad portion of the package wiring was removed by a laser drill to form an opening. After electroless nickel plating was carried out on the surface of the exposed pad, substituted gold plating was carried out. Subsequently, a solder balls was put thereon to form a solder bump to form a semiconductor package. Even if an epoxy resin or benzocyclobutene resin was used as the impregnated resin in place of the isocyanate ester resin, the semiconductor package was similarly prepared.

In addition, it was possible to prepare a semiconductor package by the same process, except that a halftone mask for causing the quantity of light transmitted in a portion exposing the wiring portions to be 10% of the quantity of light transmitted in a portion exposing the via contacts was used in place of exposure operations for the wiring portion and via contact separately carried out twice, and that exposure was carried out on the conditions of a light exposure of 2000 mJ/cm$^2$ (wavelength 436 nm).

Moreover, it was possible to prepare a semiconductor module comprising two semiconductor chips and a package wiring for interconnecting them by the same process, except that the two semiconductor chips were applied on the porous sheet.

Before the porous sheet was impregnated with a resin liquid which was heated and cured, the PTFE porous sheet was peeled off. As a result, it was possible to remove the porous sheet with the wiring portions and via contacts without damaging the semiconductor chip. It was possible to rework the semiconductor chip after removing the porous sheet, without producing contamination and remaining residuals of via contacts.

As a comparative example, a semiconductor package applied on a semiconductor chip was prepared after via contacts and wiring portions were formed. First, a PTFE porous sheet having the same via contacts and surface wiring was prepared without being applied on a semiconductor chip, and this sheet was impregnated with the same cyanate ester resin solution. Thereafter, the sheet was pressed to be bonded to the semiconductor chip. In this semiconductor package, the resistance between the electrode of the semiconductor chip and the via contact is higher than that in the semiconductor package prepared in this example. In addition, after a heat cycle test was carried out, the interface between the electrode and the via contact was easily peeled off, so that reliability was inferior.

As described above, according to the present invention, it is possible to connect to an electronic device having a narrow pad pitch, it is difficult to cause displacement, and it is possible to carry out rework.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. An electronic device connecting method comprising:
   mounting an electrode of an electronic device closely on
      a sheet-like porous member having pores, the porous member having a photosensitive layer formed on an inner surface of pores, the photosensitive layer producing or eliminating an ion exchange group by irradiation with energy beams on the inner surface of the pores;

selectively irradiating a predetermined region of the porous member, on which the electronic device is mounted, with energy beams thereby exposing the photosensitive layer to form a latent image in an irradiated or non-irradiated portion of the porous member, the predetermined region including a portion close to the electrode;

after said selectively irradiating, filling pores in the latent image of the porous member with a conductive material to simultaneously form a wiring portion and a via contact connected to the electrode; and bonding the porous member, in which the wiring portion and the via contact are formed by said filling, to the electronic device.

2. An electronic device connecting method as set forth in claim 1, wherein the mounting comprises pressure sensitive adhesion.

3. An electronic device connecting method as set forth in claim 1, wherein the photosensitive layer produces or eliminates an ion exchange group in an irradiated or non-irradiated portion of the photosensitive layer of the porous member to form a pattern of an ion exchange group by the energy beams, and the wiring portion and the via contact are formed by selectively absorbing a conductive material or its precursor onto the pattern of the ion exchange group which is formed in the irradiated or non-irradiated portion of the photosensitive layer.

4. An electronic device connecting method as set forth in claim 3, further comprising;

electroless plating by using the conductive material or its precursor as a plating nucleus.

5. An electronic device connecting method as set forth in claim 1, wherein the wiring portion and the via contact comprise a region which passes through the porous member, and a region which does not pass through the porous member.

6. An electronic device connecting method as set forth in claim 1, wherein the bonding comprises curing after a curing resin impregnates the porous member.

* * * * *